(12) United States Patent
Sasaki et al.

(10) Patent No.: US 11,824,521 B2
(45) Date of Patent: Nov. 21, 2023

(54) VIBRATION SUBSTRATE HAVING A PAIR OF HOLDING PORTIONS AND A BEAM PORTION CONNECTING THE HOLDING PORTIONS, VIBRATOR, AND VIBRATOR UNIT

(71) Applicant: Murata Manufacturing Co., Ltd., Nagaokakyo (JP)

(72) Inventors: Hayato Sasaki, Nagaokakyo (JP); Toru Kizu, Nagaokakyo (JP); Hiroshi Kumano, Nagaokakyo (JP); Yuuki Ooi, Nagaokakyo (JP); Hiroaki Kaida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 765 days.

(21) Appl. No.: 16/940,125

(22) Filed: Jul. 27, 2020

(65) Prior Publication Data

US 2020/0366269 A1 Nov. 19, 2020

Related U.S. Application Data

(63) Continuation of application No. PCT/JP2019/007208, filed on Feb. 26, 2019.

(30) Foreign Application Priority Data

Feb. 28, 2018 (JP) .................... 2018-035589

(51) Int. Cl.
*H03H 9/19* (2006.01)
*H03H 9/02* (2006.01)
(Continued)

(52) U.S. Cl.
CPC .......... *H03H 9/19* (2013.01); *H03H 9/02023* (2013.01); *H03H 9/0509* (2013.01); *H03H 9/1021* (2013.01)

(58) Field of Classification Search
CPC .... H03H 9/19; H03H 9/02023; H03H 9/0509; H03H 9/1021; H03H 9/0519; H03H 9/177

See application file for complete search history.

(56) References Cited

U.S. PATENT DOCUMENTS 7,012,355 B2    3/2006  Oda et al.
2004/0036380 A1  2/2004  Oda et al.
(Continued)

FOREIGN PATENT DOCUMENTS

JP    53132988 A    11/1978
JP   200488138 A     3/2004
(Continued)

OTHER PUBLICATIONS

International Search Report Issued for PCT/JP2019/007208, dated May 14, 2019.

(Continued)

*Primary Examiner* — Emily P Pham
(74) *Attorney, Agent, or Firm* — ArentFox Schiff LLP

(57) ABSTRACT

The vibration substrate having a main surface extending parallel to a first direction and a second direction that are orthogonal to each other, and that includes a main body region having a vibrating portion at least in a part thereof and at least one holding region arranged side by side with the main body region along the first direction. The at least one holding region including a holding portion and a beam portion connecting the holding portion and the main body region. The beam portion includes a first arm portion extending from the holding portion along the first direction, a second arm portion extending along the second direction from an end portion of the first arm portion on a side thereof (Continued)

opposite to the holding portion, and a connection portion connecting the second arm portion and the main body region.

25 Claims, 11 Drawing Sheets

(51) Int. Cl.
    *H03H 9/05*     (2006.01)
    *H03H 9/10*     (2006.01)

(56) References Cited

U.S. PATENT DOCUMENTS

| | | | |
|---|---|---|---|
| 2008/0036335 A1 | 2/2008 | Naito et al. | |
| 2009/0300894 A1 | 12/2009 | Naito et al. | |
| 2011/0068660 A1 | 3/2011 | Naito et al. | |
| 2016/0036411 A1* | 2/2016 | Shimodaira | H03H 9/08 310/345 |
| 2018/0226943 A1 | 8/2018 | Kidu et al. | |
| 2018/0226944 A1 | 8/2018 | Kidu et al. | |
| 2018/0241372 A1 | 8/2018 | Kidu et al. | |
| 2018/0248536 A1 | 8/2018 | Kidu et al. | |

FOREIGN PATENT DOCUMENTS

| | | |
|---|---|---|
| JP | 2008067345 A | 3/2008 |
| JP | 2009105776 A | 5/2009 |
| JP | 2011041040 A | 2/2011 |
| JP | 2011097623 A | 5/2011 |
| JP | 2012134824 A | 7/2012 |
| JP | 2013012965 A | 1/2013 |
| WO | 2017061591 A1 | 4/2017 |

OTHER PUBLICATIONS

Written Opinion of the International Searching Authority issued for PCT/JP2019/007208, dated May 14, 2019.

* cited by examiner

VIBRATION SUBSTRATE HAVING A PAIR OF HOLDING PORTIONS AND A BEAM PORTION CONNECTING THE HOLDING PORTIONS, VIBRATOR, AND VIBRATOR UNIT

CROSS REFERENCE TO RELATED APPLICATIONS

The present application is a continuation of International application No. PCT/JP2019/007208, filed Feb. 26, 2019, which claims priority to Japanese Patent Application No. 2018-035589, filed Feb. 28, 2018, the entire contents of each of which are incorporated herein by reference.

FIELD OF THE INVENTION

The present invention relates to a vibration substrate, a vibrator provided with the vibration substrate, and a vibrator unit provided with the vibrator.

BACKGROUND OF THE INVENTION

In an electronic device such as a mobile computer, a portable game device, a mobile phone, an IC card, a communication base station, or the like, a vibrator unit is widely used as an electronic device such as a timing device or a vibration gyro sensor, or the like. As electronic devices have been reduced in size and improved in performance, the vibrator units are also required to be reduced in size and to have high performance.

The vibrator unit includes, for example, a vibration substrate including a holding region and a main body region, an outer substrate upon which the vibration substrate is mounted, and a conductive holding member bonding the holding region to the outer substrate. When the vibrator unit is reduced in size, strain may occur in the main body region due to a decrease in mechanical strength resulting from thinning of the vibration substrate, approach of the holding region of the vibration substrate to the main body region, and the like, and the characteristics of the vibrator unit may fluctuate. For example, Patent Document 1 discloses a vibration substrate in which recess portions are provided in both sides in a width direction of a vibration substrate between a holding portion of a holding region and a central portion of a main body region, and a narrow portion is formed between the holding portion and the central portion.

Patent Document 1: Japanese Unexamined Patent Application Publication No. 2004-88138

SUMMARY OF THE INVENTION

However, the vibration substrate described in Patent Document 1 may not sufficiently reduce the fluctuation in the vibration characteristics due to the influence of the stress propagating from the outer substrate to the main body region of the vibration substrate via the holding region of the vibration substrate.

The present invention has been achieved in light of aforementioned circumstances, and an object of the present invention is to provide a vibration substrate, a vibrator, and a vibrator unit capable of improving the stability of vibration characteristics.

The vibration substrate according to an aspect of the present invention is a vibration substrate having a main surface that extends parallel to a first direction and a second direction which are orthogonal to each other, and includes a main body region including a vibrating portion at least in a part thereof, and at least one holding region arranged side by side with the main body region along the first direction. The at least one holding region includes a holding portion and a beam portion connecting the holding portion and the main body region. The beam portion includes a first arm portion extending from the holding portion along the first direction, a second arm portion extending along the second direction from an end portion of the first arm portion on a side thereof opposite to the holding portion, and a connection portion connecting the second arm portion and the main body region.

A vibration substrate according to another aspect of the present invention is a vibration substrate having a main surface that extends parallel to a first direction and a second direction which are orthogonal to each other, and includes a main body region including a vibrating portion at least in a part thereof, and at least one holding region arranged side by side with the main body region along the first direction. The at least one holding region includes a holding portion holding the vibration substrate. The holding region defines a first recess portion extending from an outer side portion of the holding portion along the first direction and a second recess portion extending from the outer side portion along the second direction, and the first recess portion and the second recess portion overlap with each other along the first direction.

According to the present invention, it is possible to provide a vibration substrate, a vibrator, and a vibrator unit capable of improving the stability of vibration characteristics.

DETAILED DESCRIPTION OF THE PREFERRED EMBODIMENTS

Figure 1:
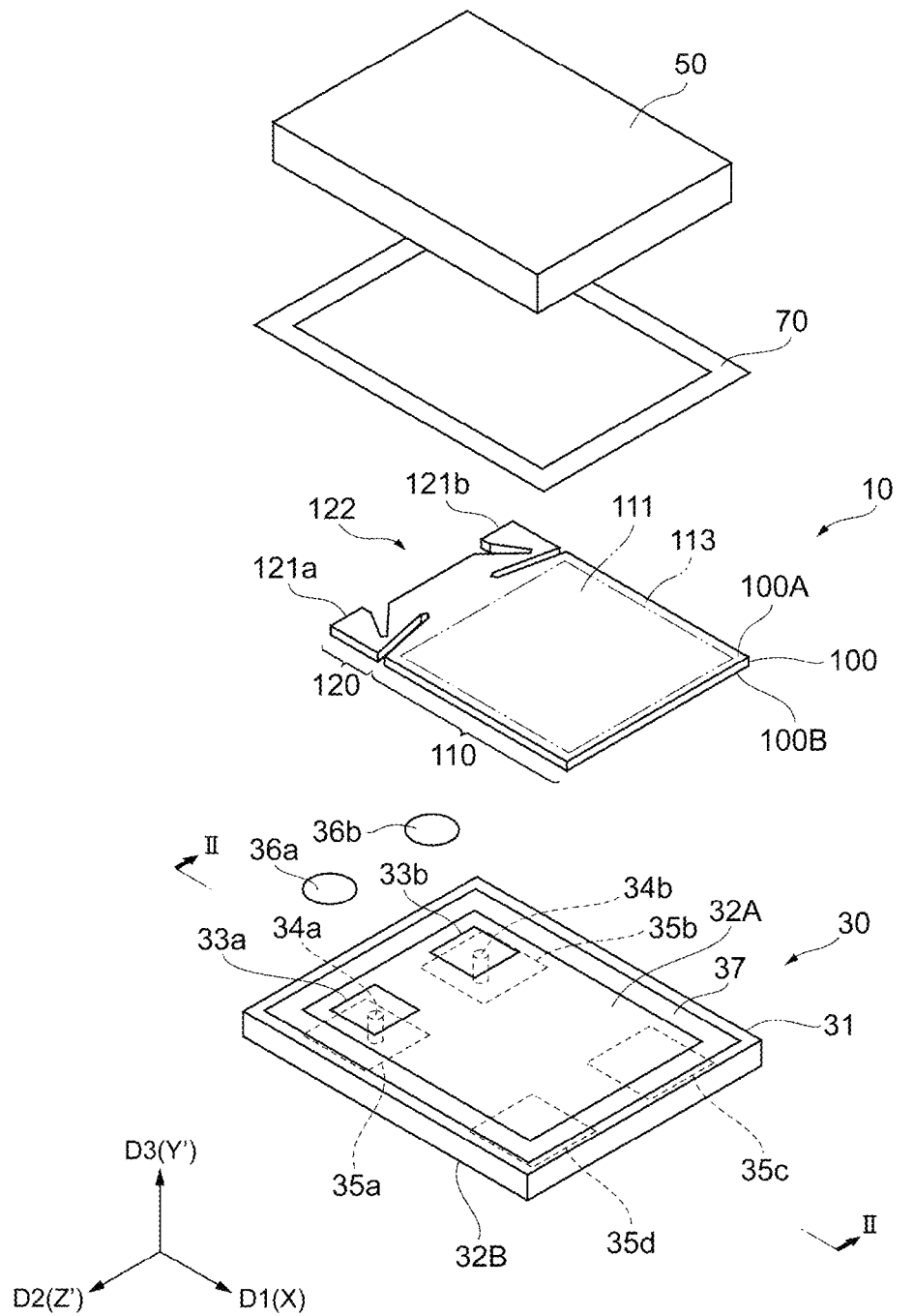
FIG. 1 is an exploded perspective view schematically illustrating a configuration of a quartz crystal vibrator unit according to a first embodiment.

Hereinafter, an embodiment of the present invention will be described with reference to the accompanying drawings. In the second and subsequent embodiments, constituent elements that are the same as or similar to those of the first embodiment are denoted by the same reference numerals as those in the first embodiment, and detailed description thereof will be omitted as appropriate. Further, in the effects obtained in the embodiments, which are the second and subsequent embodiments, description of those same in the first embodiment will be omitted as appropriate. The drawings of the respective embodiments are illustrative, the dimensions and shapes of respective portions are schematic, and the technical scope of the present invention should not be limited to the embodiments.

In each drawing, an orthogonal coordinate system including a first direction D1, a second direction D2, and a third direction D3 may be provided for convenience to clarify the relationship among respective drawings and to facilitate the understanding of the positional relationship among respective members. The first direction D1, the second direction D2, and the third direction D3 mean three reference directions illustrated in FIG. 1, and include the positive direction (direction of arrow) and the negative direction (direction opposite to arrow), respectively. In addition, the first direction D1, the second direction D2, and the third direction D3 illustrated in the drawings are directions orthogonal to each other, respectively, for example. Note that the first direction D1, the second direction D2, and the third direction D3 may be directions intersecting with one another at an angle other than 90°.

In the following description, as an example of a piezoelectric vibrator unit, a quartz crystal vibrator unit provided with a quartz crystal vibrator will be described. The quartz crystal vibrator uses a quartz crystal element formed of quartz crystal as a piezoelectric body that vibrates in accordance with an applied voltage. The quartz crystal vibrator unit corresponds to an example of a vibrator unit, the quartz crystal vibrator corresponds to an example of a vibrator, and the quartz crystal element corresponds to an example of a vibration substrate.

Note that the vibration substrate according to the embodiment of the present invention is not limited to the quartz crystal element. The vibration substrate may be a piezoelectric body element formed of any piezoelectric material such as a piezoelectric single crystal, a piezoelectric ceramic, a piezoelectric thin film, a piezoelectric polymer film, or the like. As an example of the piezoelectric single crystal, lithium niobate ($LiNbO_3$) may be cited. Similarly, the piezoelectric ceramic may include barium titanate ($BaTiO_3$), lead titanate ($PbTiO_3$), lead zirconate titanate ($Pb(Zr_xTi_{1-x})O_3$; PZT), aluminum nitride (AlN), lithium niobate ($LiNbO_3$), lithium metaniobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), tantalum pentoxide ($Ta_2O_5$), and the like. The piezoelectric thin film may include a thin film formed by depositing the above-described piezoelectric ceramic on a substrate such as quartz or sapphire by a sputtering method or the like. The piezoelectric polymer film may include polylactic acid (PLA), polyvinylidene fluoride (PVDF), a vinylidene fluoride/trifluoroethylene copolymer (P(VDF/TrFE)), and the like. The above-described various piezoelectric materials may be stacked on one another, or may be stacked on another member. Further, the vibrator according to the embodiment of the present invention is not limited to the piezoelectric vibrator. The vibration substrate may be formed of an insulation material having no piezoelectricity or low piezoelectricity, and may be formed of a semiconductor material or a conductive material.

First Embodiment

Figure 2:
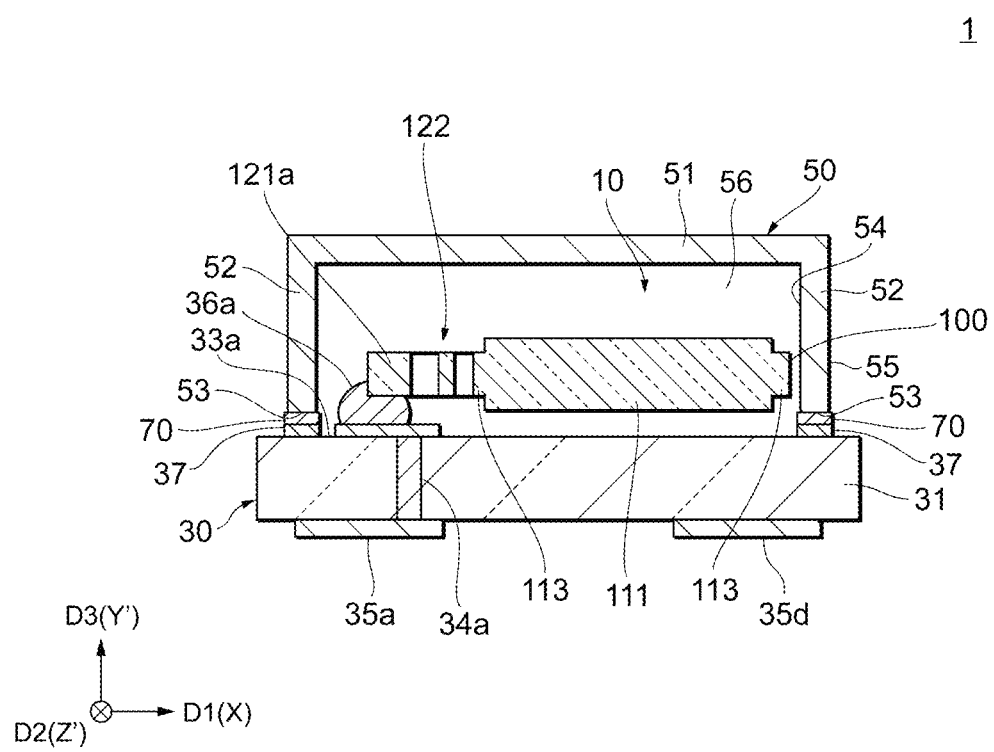
FIG. 2 is a sectional view schematically illustrating a configuration of a section taken along a line II-II of the quartz crystal vibrator unit illustrated in FIG. 1.

First, a configuration of a quartz crystal vibrator unit 1 according to a first embodiment of the present invention will be described with reference to FIG. 1 and FIG. 2. FIG. 1 is an exploded perspective view schematically illustrating a configuration of a quartz crystal vibrator unit 1 according to the first embodiment. FIG. 2 is a sectional view schematically illustrating a configuration of a section taken along a line II-II of the quartz crystal vibrator unit illustrated in FIG. 1.

The quartz crystal vibrator unit 1 includes a quartz crystal vibrator 10, a lid member 50, a base member 30, and a bonding member 70. The quartz crystal vibrator 10 is a type of a vibrator. For example, the quartz crystal vibrator 10 corresponds to an example of a piezoelectric drive type vibrator that generates vibration with a piezoelectric effect. The base member 30 and the lid member 50 are retainers for accommodating the quartz crystal vibrator 10. In the example illustrated in FIG. 1 and FIG. 2, the lid member 50 has a recessed shape, specifically, a box shape having a cavity, and the base member 30 has a flat plate shape. The shape of the lid member and the base member is not limited to the above, and for example, the base member may have a recessed shape, or both of the lid member and the base member may have a recessed shape having respective cavities facing the other.

First, the quartz crystal vibrator 10 will be described.

The quartz crystal vibrator 10 includes a plate shaped quartz crystal element 100. The quartz crystal element 100 corresponds to an example of a piezoelectric substrate. The quartz crystal element 100 has a first main surface 100A and a second main surface 100B opposing to each other. The first main surface 100A is located on a side opposite to a side facing the base member 30, that is, on a side facing the lid member 50. The second main surface 100B is located on a side facing the base member 30.

The quartz crystal element 100 is, for example, an AT-cut quartz crystal element. In an orthogonal coordinate system including an X-axis, a Y'-axis, and a Z'-axis that intersect one another, the AT-cut quartz crystal element 100 is formed such that a plane parallel to the plane specified by the X-axis and the Z'-axis is a main surface and a direction parallel to the Y'-axis is a thickness direction. Hereinafter, a plane parallel to the plane specified by the X-axis and the Z'-axis is referred to as "XZ' plane" and this is also the same to the plane specified by other axes or other directions. For example, the AT-cut quartz crystal element 100 is formed by etching processing of a quartz crystal wafer obtained by cutting and polishing of a synthetic quartz crystal ingot.

The quartz crystal vibrator 10 using the AT-cut quartz crystal element 100 has high frequency stability in a wide temperature range. In the AT-cut quartz crystal vibrator 10, a thickness shear vibration mode is used as a main vibration.

The X-axis, the Y-axis, and the Z-axis are crystallographic axes of quartz crystal. Each of the X-axis, the Y-axis, and the Z-axis is a crystallographic axis of quartz crystal, and the X-axis corresponds to an electric axis (polar axis), the Y-axis corresponds to a mechanical axis, and the Z-axis corresponds to an optical axis. The Y'-axis is an axis obtained by rotating the +Y side of the Y-axis to tilt toward the+side of the Z-axis when the X-axis is taken as a rotation axis. The Z'-axis is an axis obtained by rotating the +Z side of the Z-axis to tilt toward the—side of the Y-axis. In the AT-cut quartz crystal element 100, the Y'-axis and the Z'-axis are axes obtained by rotating the Y-axis and the Z-axis by 35 degrees and 15 minutes ±1 minute and 30 seconds in the direction from the Y-axis to the Z-axis around the X-axis, respectively. In the AT-cut, each of the rotation angles of the Y'-axis and the Z'-axis from the Y-axis and the Z-axis may vary from the reference angle (35 degrees and 15 minutes). However, from the viewpoint of reducing the resonant frequency change due to temperature change, the variation from the reference angle in the AT cut is preferably in the range of −5 degrees or more and 15 degrees or less. Note that the cut angle of a quartz crystal element may apply a cut other than the AT-cut (for example, BT-cut). For example, a cut may be acceptable in which the Y'-axis and the Z'-axis are the Y-axis and the Z-axis, respectively.

In the first embodiment, the quartz crystal vibrator 10 is arranged such that the X-axis is parallel to the first direction D1, the Z'-axis is parallel to the second direction D2, and the Y'-axis is parallel to the third direction D3. In the following description, directions parallel to the X-axis, the Y'-axis, and the Z'-axis are referred to as an X-axis direction, a Y'-axis direction, and a Z'-axis direction, respectively. Further, in the X-axis direction, a +X-axis direction is defined as a positive direction of the first direction D1, and a −X-axis direction is defined as a negative direction of the first direction D1. Similarly, in the Y'-axis direction, a +Y'-axis direction is defined as a positive direction of the third direction D3, and a −Y'-axis direction is defined as a negative direction of the third direction D3. In the Z'-axis direction, a +Z'-axis direction is defined as a positive direction of the second direction D2, and a −Z'-axis direction is defined as a negative direction of the second direction D2. That is, in the embodiment of the present invention, the X-axis direction corresponds to the first direction D1, the Z'-axis direction corresponds to the second direction D2, and the Y'-axis corresponds to the third direction D3. Thus, it is possible to express that the first main surface 100A and the second main surface 100B of the AT-cut quartz crystal element 100 are main surfaces along directions parallel to the first direction D1 and the second direction D2.

The quartz crystal element 100 has a plate shape having a long side direction in which a long side parallel to the X-axis direction extends, a short side direction in which a short side parallel to the Z'-axis direction extends, and a thickness direction in which a thickness parallel to the Y'-axis direction extends. The quartz crystal element 100 includes a main body region 110 and a holding region 120 arranged side by side in the X-axis direction.

The main body region 110 has a substantially rectangular shape having a long side along the X-axis direction and a short side along the Z'-axis direction when the first main surface 100A is viewed in plan. The main body region 110 includes a central portion 111 located at a central portion and contributing to excitation, and a peripheral portion 113 adjacent to the central portion 111. The peripheral portion 113 is provided in a frame shape so as to surround the central portion 111. Therefore, the central portion 111 is adjacent to the peripheral portion 113 in any of the ±X-axis direction and the ±Z'-axis direction. The thickness of the peripheral portion 113 is smaller than the thickness of the central portion 111. On both the first main surface 100A side and the second main surface 100B side, the central portion 111 protrudes from the peripheral portion 113 along the Y'-axis direction. The surface of the central portion 111 and the surface of the peripheral portion 113 are connected by a tapered surface. That is, the main body region 110 has a double-sided mesa type structure in which both of the first main surface 100A side and the second main surface 100B side are in a mesa shape. With this, in the quartz crystal element 100, it is possible to suppress the vibration leakage from the central portion 111 to the peripheral portion 113.

The peripheral portion is not limited to a frame shape, and may be connected to both end sides of the central portion so as to be arranged side by side with the central portion, or may be connected to one end side of the central portion. Further, the main body region is not limited to a double-sided mesa type structure, and may have a single-sided mesa type structure in which the first main surface side or the second main surface side has a mesa shape. The main body region may have a convex shape or a bevel shape in which a thickness between the central portion and the peripheral portion continuously changes, or may have a flat plate shape in which thicknesses of the central portion and the peripheral portion are the same. The shape of the main body region is not limited to a plate shape, and may be a comb-tooth type or a tuning-fork type in which the plurality of central portions extends in parallel from the peripheral portion.

The holding region 120 is provided on the −X-axis direction side of the main body region 110 when the first main surface 100A is viewed in plan. The holding region 120 has a pair of holding portions 121a and 121b, and a beam portion 122. The pair of holding portions 121a and 121b are portions for holding the quartz crystal element 100 with respect to the base member 30. The pair of holding portions 121a and 121b are arranged side by side along the Z'-axis direction at the end portion on the −X-axis direction side of the quartz crystal element 100. The first holding portion 121a is provided at a corner portion in the +Z'-axis direction side of the quartz crystal element 100, and the second holding portion 121b is provided at a corner portion in the -Z'-axis direction side of the quartz crystal element 100. The beam portion 122 is a portion for connecting the pair of holding portions 121a and 121b and the main body region 110. The beam portion 122 is connected to the central portion in the Z'-axis direction of the peripheral portion 113, in the side of the pair of holding portions 121a and 121b viewed from the main body region 110. In addition, the beam portion 122 has a constricted shape in which a width in the Z'-axis direction is partially narrowed.

Note that the number of holding regions is not limited to one, and two or more holding regions may be provided. For example, the holding region may be provided on the +X-axis direction side and the −X-axis direction side of the main body region so as to sandwich the main body region. In addition, the number of holding portions is not limited to two, and one holding portion may be provided, and three or more holding portions may be provided.

Next, the lid member 50 will be described.

The lid member 50 has a recessed shape and has a box shape that opens toward a third main surface 32A of the base member 30. The lid member 50 is bonded to the base member 30, and an internal space 56 surrounded by the lid member 50 and the base member 30 is provided. The quartz crystal vibrator 10 is accommodated in the internal space 56. The lid member 50 has, for example, a long side parallel to the first direction D1, a short side parallel to the second direction D2, and a height parallel to the third direction D3.

The material of the lid member 50 is not particularly limited, and is made of, for example, a conductive material such as a metal. By including the conductive material, the lid member 50 may have an electromagnetic shielding function for shielding at least part of the electromagnetic waves to be input/output to/from the internal space 56.

The lid member 50 has a top portion 51 facing the third main surface 32A of the base member 30, and a side wall portion 52 connected to an outer edge of the top portion 51 and extending in a direction intersecting with the main surface of the top portion 51. The shape of the lid member 50 is not particularly limited as long as it may accommodate the quartz crystal vibrator 10. For example, the lid member 50 may have a substantially rectangular shape when viewed in plan from the normal direction of the main surface of the top portion 51. As illustrated in FIG. 2, the lid member 50 has an inner surface 54 and an outer surface 55. The inner surface 54 is a surface of the internal space 56 side, and the outer surface 55 is a surface opposite to the inner surface 54. Further, the lid member 50 has an opposing surface 53 facing the third main surface 32A of the base member 30 at an open end portion of the recessed shape (end portion of the side wall portion 52 closer to the base member 30). The opposing surface 53 extends in a frame shape so as to surround the periphery of the quartz crystal vibrator 10.

Next, the base member 30 will be described.

The base member 30 holds the quartz crystal vibrator 10 so as to be capable of exciting. The base member 30 has a flat plate shape. The base member 30 has a long side parallel to the first direction D1, a short side parallel to the second direction D2, and a thickness parallel to the third direction D3. The base member 30 has a base body 31. The base body 31 has the third main surface 32A (front surface) and a fourth main surface 32B (back surface) opposing to each other. The base body 31 is a sintered material such as an insulation ceramic (alumina), for example. The base body 31 is preferably made of a heat-resistant material.

A first electrode pad 33a and a second electrode pad 33b are provided on the third main surface 32A of the base member 30. A first outer electrode 35a, a second outer electrode 35b, a third outer electrode 35c, and a fourth outer electrode 35d are provided on the fourth main surface 32B of the base member 30. The first electrode pad 33a and the second electrode pad 33b are terminals to electrically connect the base member 30 and the quartz crystal vibrator 10. The first outer electrode 35a and the second outer electrode 35b are terminals to electrically connect a circuit substrate, which is not illustrated, and the quartz crystal vibrator unit 1. The first electrode pad 33a and the second electrode pad 33b are arranged side by side along the second direction D2. The first outer electrode 35a and the fourth outer electrode 35d are arranged side by side along the first direction D1. The second outer electrode 35b and the third outer electrode 35c are arranged side by side along the first direction D1. The first electrode pad 33a is electrically connected to the first outer electrode 35a using a first via electrode 34a extending in the third direction D3. The second electrode pad 33b is electrically connected to the second outer electrode 35b using a second via electrode 34b extending in the third direction D3. The first via electrode 34a and the second via electrode 34b are formed in via holes passing through the base body 31 in the third direction D3. The third outer electrode 35c and the fourth outer electrode 35d may be dummy electrodes for which an electrical signal or the like is not input/output, or may be a ground electrode for improving the electromagnetic shielding function of the lid member 50 by supplying the ground potential to the lid member 50. The third outer electrode 35c and the fourth outer electrode 35d may be omitted.

Next, a first conductive holding member 36a and a second conductive holding member 36b will be described.

The first conductive holding member 36a and the second conductive holding member 36b are provided on the third main surface 32A side of the base member 30, specifically on the first electrode pad 33a and the second electrode pad 33b. The first conductive holding member 36a and the second conductive holding member 36b mount the quartz crystal vibrator 10 on the base member 30, and electrically connect the quartz crystal vibrator 10 and the base member 30. The first conductive holding member 36a is bonded to the first holding portion 121a, and is electrically connected to the first electrode pad 33a. The second conductive holding member 36b is bonded to the second holding portion 121b and electrically connected to the second electrode pad 33b. The first conductive holding member 36a and the second conductive holding member 36b hold the quartz crystal vibrator 10 at a distance from the base member 30 so that the central portion 111 of the main body region 110 may be excited. The first conductive holding member 36a and the second conductive holding member 36b are made of, for example, a conductive adhesive containing a thermosetting resin of which main material is an epoxy-based resin or a silicone-based resin, an ultraviolet curable resin, or the like, and contain an additive such as conductive particles for imparting conductivity to the adhesive. The first conductive holding member 36a and the second conductive holding member 36b are provided by applying a conductive adhesive paste as a precursor, and then curing the conductive adhesive paste by a chemical reaction caused by heating, ultraviolet irradiation, or the like. Further, a filler may be added to the adhesive for the purpose of increasing the strength, or for the purpose of maintaining the distance between the base member 30 and the quartz crystal vibrator 10. Note that the first conductive holding member 36a and the second conductive holding member 36b may be made of solder.

Next, a sealing member 37 and the bonding member 70 will be described.

The sealing member 37 is provided on the third main surface 32A of the base member 30. In the example illustrated in FIG. 1, the sealing member 37 has a substantially rectangular frame shape when the third main surface 32A is viewed in plan. When the third main surface 32A is viewed in plan, the first electrode pad 33a and the second electrode pad 33b are arranged inside the sealing member 37, and the sealing member 37 is provided so as to surround the quartz crystal vibrator 10. The sealing member 37 is made of a conductive material. For example, since the sealing member 37 is formed of the same material as that of the first electrode pad 33a and the second electrode pad 33b, the sealing member 37 may be provided at the same time in the process of providing the first electrode pad 33a and the second electrode pad 33b, thereby simplifying the manufacturing process.

The bonding member 70 is provided to the entire circumference of the lid member 50 and the base member 30. Specifically, the bonding member 70 is provided on the sealing member 37, and is formed in a substantially rectangular frame shape. The sealing member 37 and the bonding member 70 are sandwiched between the opposing surface 53 of the side wall portion 52 of the lid member 50 and the third main surface 32A of the base member 30. The bonding member 70 has better adhesion to the sealing member 37 than the adhesion to the base body 31. The bonding member 70 is provided by, for example, Au—Sn alloy based solder.

The lid member 50 and the base member 30 are bonded to each other with the bonding member 70 interposed therebetween, so that the quartz crystal vibrator 10 is sealed in the internal space (cavity) 56 surrounded by the lid member 50 and the base member 30. The air pressure in the internal space 56 is lower than the atmospheric pressure. It is further preferable that the internal space 56 be in a vacuum state. With this, it is possible to suppress oxidation of such as the various electrodes provided to the quartz crystal vibrator 10 and the base member 30, the first conductive holding member 36a, the second conductive holding member 36b, and the like. Therefore, it is possible to reduce the fluctuation of the frequency characteristics of the quartz crystal vibrator unit 1 over time and the occurrence of the operational defect of the quartz crystal vibrator unit 1, which are due to the deterioration of the conductive material such as for the electrodes.

Since the sealing member 37 and the bonding member 70 overlap with each other in a frame shape, the airtightness of the internal space 56 in the quartz crystal vibrator unit 1 is improved. Further, since the sealing member 37 is provided, the adhesion between the base member 30 and the bonding member 70 is improved in the quartz crystal vibrator unit 1, and the airtightness of the internal space 56 is improved. Note that the sealing member 37 may be provided in a discontinuous frame shape and the bonding member 70 may be provided in a discontinuous frame shape. The sealing member 37 may be omitted. The bonding member 70 may be provided with a conductive adhesive, a glass-based adhesive, or the like.

Next, the detailed configuration of the quartz crystal vibrator 10 will be described with reference to FIG. 3 to FIG. 7.

Figure 3:
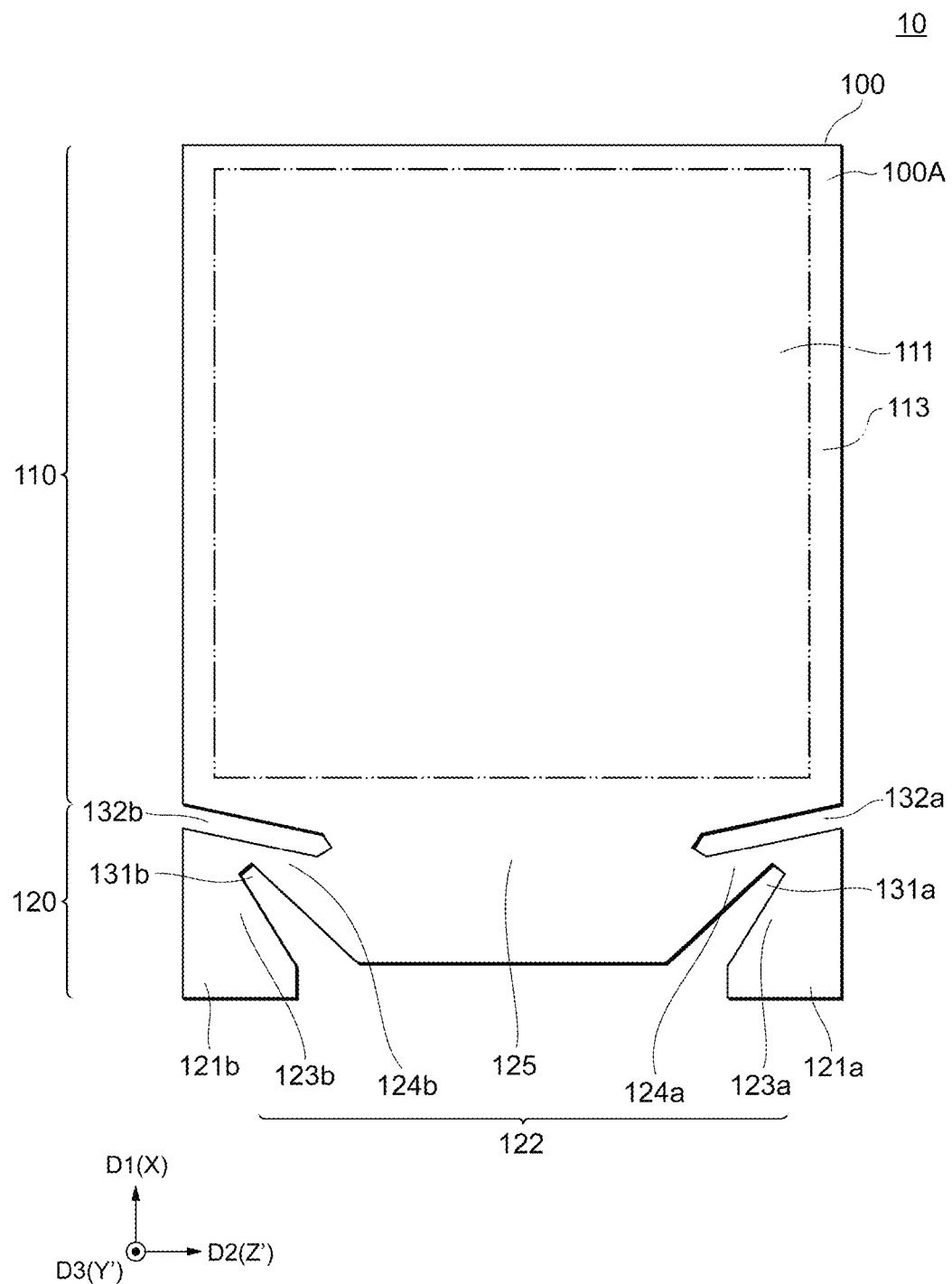
FIG. 3 is a plan view schematically illustrating a configuration of a quartz crystal element according to the first embodiment.
Figure 4:
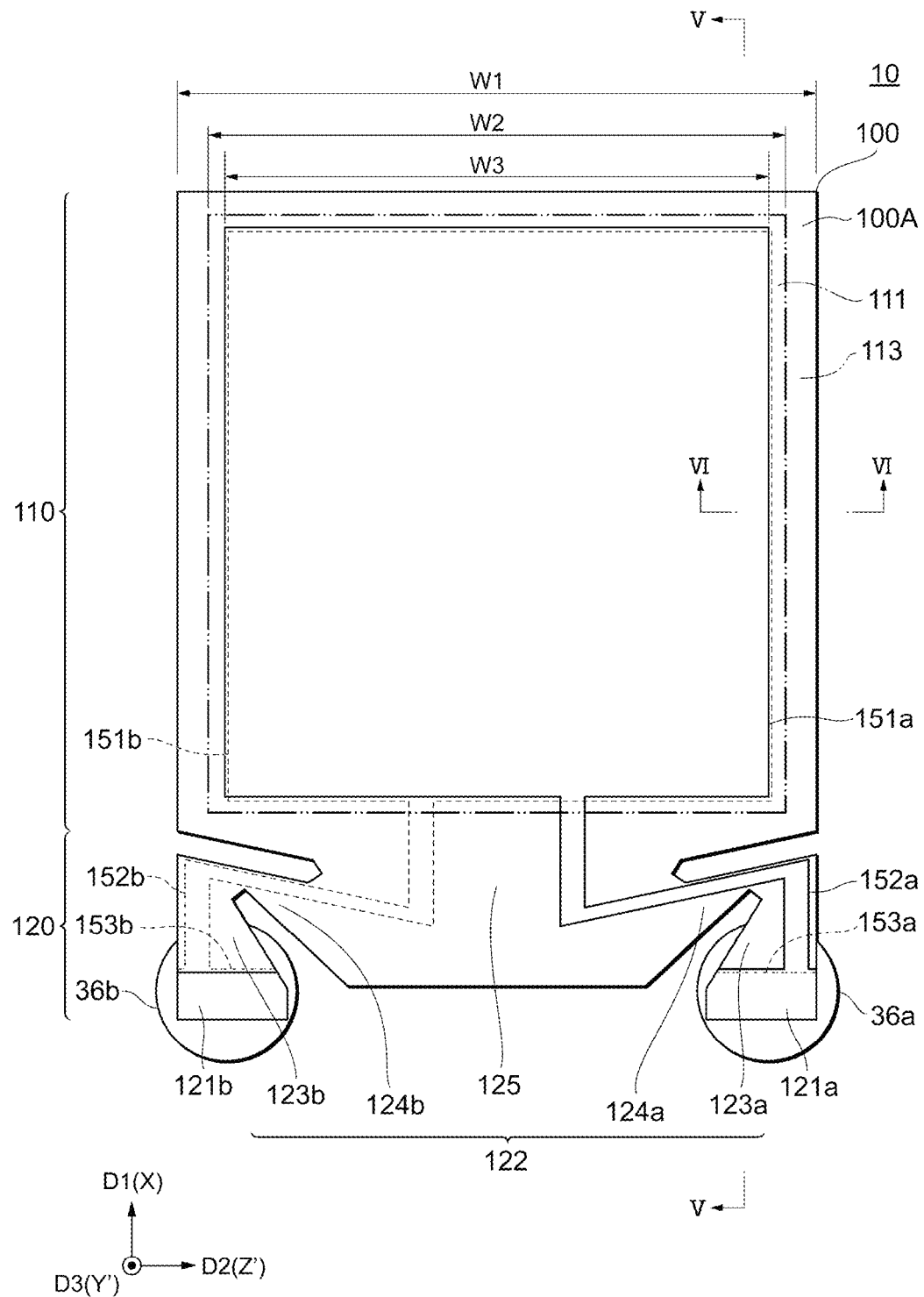
FIG. 4 is a plan view schematically illustrating a configuration of a quartz crystal vibrator according to the first embodiment.
Figure 5:
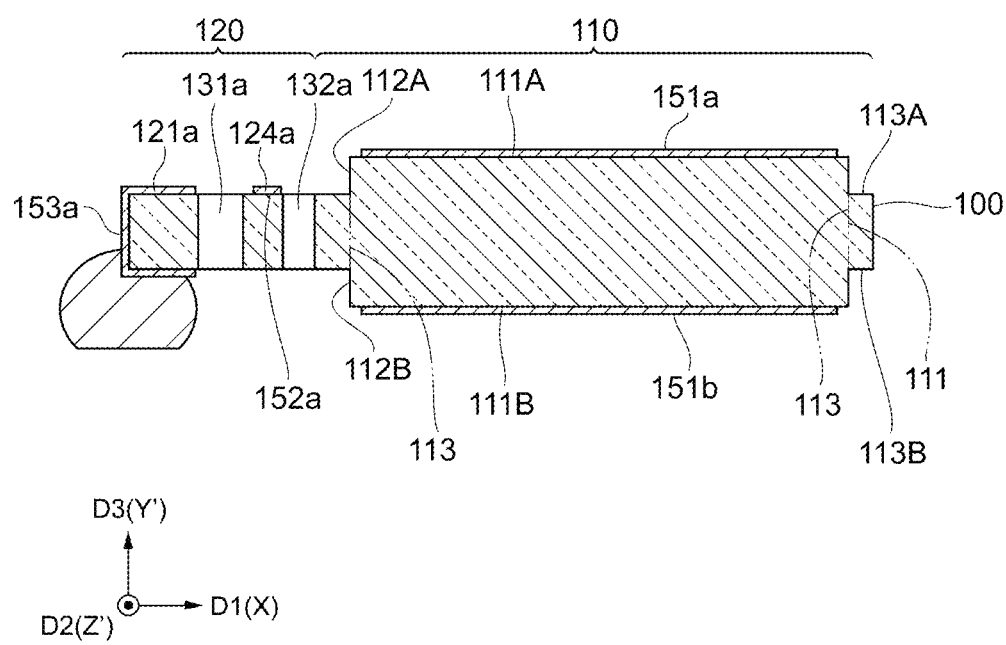
FIG. 5 is a sectional view schematically illustrating a configuration of a section taken along a line V-V of the quartz crystal vibrator illustrated in FIG. 4.
Figure 6:
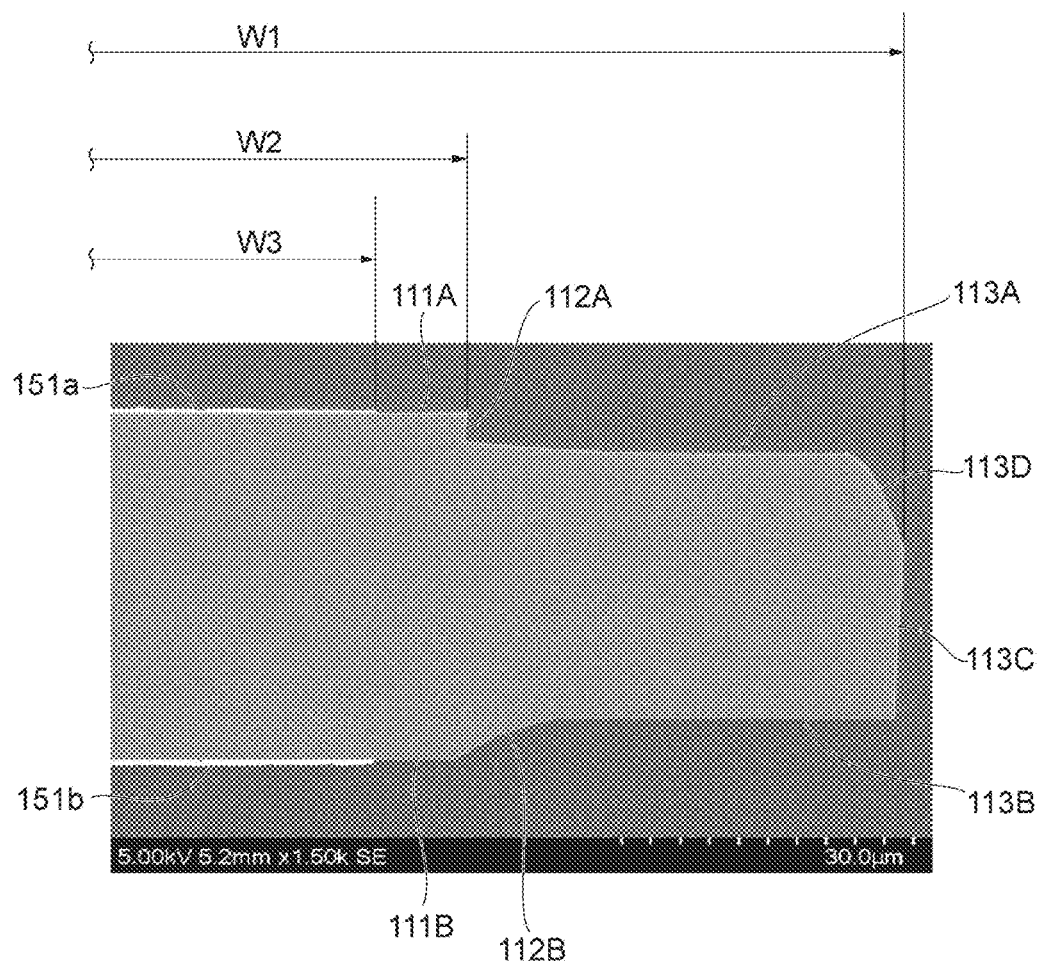
FIG. 6 is an image obtained by capturing a section taken along a line VI-VI of the quartz crystal vibrator illustrated in FIG. 4.
Figure 7:
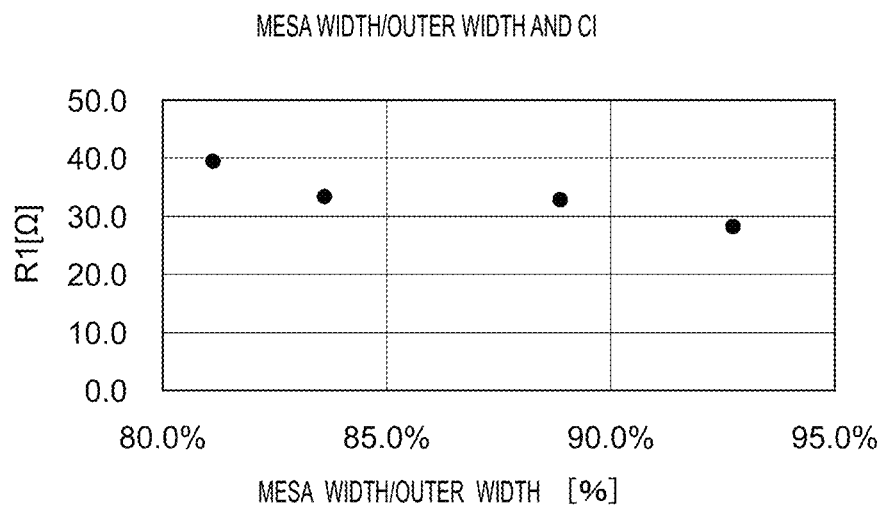
FIG. 7 is a graph plotting the correlation between the ratio of the central portion to the width of the main body region of the quartz crystal element and the CI value.

FIG. 3 is a plan view schematically illustrating a configuration of a quartz crystal element according to the first embodiment. FIG. 4 is a plan view schematically illustrating a configuration of a quartz crystal vibrator according to the first embodiment. FIG. 5 is a sectional view schematically illustrating a configuration of a section taken along a line V-V of the quartz crystal vibrator illustrated in FIG. 4. FIG. 6 is an image obtained by capturing a section taken along a line VI-VI of the quartz crystal vibrator illustrated in FIG. 4. FIG. 7 is a graph plotting the correlation between the ratio of the central portion to the width of the main body region of the quartz crystal element and the CI value. The horizontal axis of the graph described in FIG. 7 indicates the magnitude of the ratio of the width of the central portion 111 along the second direction D2 to the width of the main body region 110 along the second direction D2. The vertical axis of the graph described in FIG. 7 indicates the magnitude of the crystal impedance (CI) value of the quartz crystal vibrator 10. In the graph described in FIG. 7, the unit of the horizontal axis is %, and the unit of the vertical axis is Ω. In FIG. 7, R1 [Ω] representing the CI value was measured by sweeping at a frequency of 100 Hz and power of 30 μW.

Note that in the description of the embodiment of the present invention, "direction along the X-axis direction" is not limited to a direction parallel to the X-axis direction. The "direction along the X-axis direction" includes, for example, a direction inclined from the X-axis direction at an angle smaller than ±45°. Similarly, the "direction along the Z'-axis direction" includes not only a direction parallel to the Z'-axis direction but also, for example, a direction inclined from the Z'-axis direction at an angle smaller than ±45°.

As illustrated in FIG. 3, the beam portion 122 includes a first arm portion 123a, a second arm portion 124a, a third arm portion 123b, a fourth arm portion 124b, and a connection portion 125. In addition, in the holding region 120, a first recess portion 131a, a second recess portion 132a, a third recess portion 131b, and a fourth recess portion 132b are formed.

The configuration of the first arm portion 123a, the second arm portion 124a, the third arm portion 123b, the fourth arm portion 124b, and the connection portion 125 will be described.

When the first main surface 100A of the quartz crystal element 100 is viewed in plan, the first arm portion 123a extends from the first holding portion 121a along the X-axis direction. The second arm portion 124a extends along the Z'-axis direction from the end portion of the first arm portion 123a on the side opposite to the first holding portion 121a. With this, in the quartz crystal element 100, the stress propagating from the holding region 120 to the main body region 110 is attenuated, and strain occurred in the central portion 111 may be reduced. Therefore, in the quartz crystal vibrator unit 1, when thermal stress is occurred in the first holding portion 121a due to the difference between the thermal expansion coefficient of the base body 31 of the base member 30 and the thermal expansion coefficient of the quartz crystal element 100, it is possible to suppress the fluctuation of the vibration characteristics.

The first arm portion 123a connects the first holding portion 121a and the second arm portion 124a. That is, one end portion of the first arm portion 123a is connected to the first holding portion 121a, and the other end portion of the first arm portion 123a is connected to the second arm portion 124a. The second arm portion 124a connects the first arm portion 123a and the connection portion 125. That is, one end portion of the second arm portion 124a is connected to the first arm portion 123a, and the other end portion of the second arm portion 124a is connected to the connection portion 125. In other words, the propagation path of the stress from the first holding portion 121a to the main body region 110 is bent at least two times. Compared with a configuration in which the propagation path of the stress is linear or a configuration in which the stress propagation path is bent one time, it is possible to suppress the leakage of stress from the holding region 120 to the main body region 110 in the quartz crystal element 100.

The first arm portion 123a extends from the first holding portion 121a toward the main body region 110, that is, toward the +X-axis direction side. With this configuration, in the quartz crystal element 100, the holding region 120 may be reduced in size.

When the first main surface 100A of the quartz crystal element 100 is viewed in plan, the width of the first arm portion 123a becomes narrower from the first holding portion 121a toward the second arm portion 124a in a tapered shape. That is, the width of the first arm portion 123a along the Z'-axis direction is smaller at the end portion of the second arm portion 124a side than at the end portion of the first holding portion 121a side. With this, in the quartz crystal element 100, by forming a narrow path in the first arm portion 123a, the propagation of stress from the first holding portion 121a to the second arm portion 124a is attenuated, and the strain occurring in the central portion 111 may be reduced.

The second arm portion 124a extends from the first arm portion 123a toward the connection portion 125, that is, toward the -Z'-axis direction side. With this configuration, in the quartz crystal element 100, the holding region 120 may be reduced in size.

When the first main surface 100A of the quartz crystal element 100 is viewed in plan, the width of the second arm portion 124a becomes narrower from the connection portion 125 toward the first arm portion 123a in a tapered shape. That is, the width of the second arm portion 124a along the X-axis direction is smaller at the end portion of the first arm portion 123a side than at the end portion of the connection portion 125 side. With this, in the quartz crystal element 100, by forming a narrow path in the second arm portion 124a, the propagation of stress from the first arm portion 123a to the second arm portion 124a is attenuated, and the strain occurring in the central portion 111 may be reduced.

An extending direction of the second arm portion 124a is inclined with respect to a direction orthogonal to the extending direction of the first arm portion 123a. With this, in the quartz crystal element 100, the attenuation of the stress at the connection portion between the first arm portion 123a and the second arm portion 124a increases. In addition, in the quartz crystal element 100, the propagation path of the stress between the first holding portion 121a and the main body region 110 becomes longer. That is, in the quartz crystal element 100, the stress propagating along the beam portion 122 to the main body region 110 is attenuated, and the strain of the central portion 111 may be reduced.

The direction in which the first arm portion 123a extends is a direction parallel to the X-axis direction, and the direction in which the second arm portion 124a extends is a direction inclined from the −Z'-axis direction toward the −X-axis direction side. In other words, the angle formed by the extending direction of the second arm portion 124a and the extending direction of the first arm portion 123a is an acute angle at the inner side of the quartz crystal element 100 in the Z'-axis direction. That is, the end side of the second arm portion 124a in the +X-axis direction side is connected to the end side of the first arm portion 123a in the +Z'-axis direction side so as to form an acute angle at the inner side of the holding region 120 in the Z'-axis direction. With this, in the quartz crystal element 100, the stress may be reflected and propagated toward a direction away from the main body region 110 in the connection portion between the first arm portion 123a and the second arm portion 124a. For this reason, in the quartz crystal element 100, the stress propagating to the main body region 110 may be attenuated.

When the first main surface 100A of the quartz crystal element 100 is viewed in plan, the third arm portion 123b extends from the second holding portion 121b along the X-axis direction. The fourth arm portion 124b extends along the Z'-axis direction from an end portion of the third arm portion 123b on the side opposite to the second holding portion 121b. The third arm portion 123b connects the second holding portion 121b and the fourth arm portion 124b. That is, one end portion of the third arm portion 123b is connected to the second holding portion 121b, and the other end portion of the third arm portion 123b is connected to the fourth arm portion 124b. The fourth arm portion 124b connects the third arm portion 123b and the connection portion 125. That is, one end portion of the fourth arm portion 124b is connected to the third arm portion 123b, and the other end portion of the fourth arm portion 124b is connected to the connection portion 125.

When the first main surface 100A of the quartz crystal element 100 is viewed in plan, the third arm portion 123b extends from the second holding portion 121b toward the main body region 110, that is, toward the +X-axis direction side. The third arm portion 123b becomes narrower from the second holding portion 121b toward the fourth arm portion 124b. The fourth arm portion 124b extends from the third arm portion 123b toward the central portion of the holding region 120 in the Z'-axis direction, that is, toward the +Z'-axis direction side. The fourth arm portion 124b becomes narrower from the connection portion 125 toward the third arm portion 123b.

The direction in which the fourth arm portion 124b extends is inclined with respect to the direction in which the third arm portion 123b extends. The extending direction of the third arm portion 123b is a direction parallel to the X-axis direction, and the extending direction of the fourth arm portion 124b is a direction inclined from the +Z'-axis direction to the −X-axis direction side. In other words, the angle formed by the extending direction of the fourth arm portion 124b and the extending direction of the third arm portion 123b is an acute angle at the inner side of the quartz crystal element 100 in the Z'-axis direction.

When the first main surface 100A of the quartz crystal element 100 is viewed in plan, the configuration of the third arm portion 123b and the fourth arm portion 124b and the configuration of the first arm portion 123a and the second arm portion 124a are line symmetry, with the line passing through the connection portion 125 and parallel to the X-axis direction as the axis of symmetry. According to the third arm portion 123b and the fourth arm portion 124b, the same effect as the effect obtained by the first arm portion 123a and the second arm portion 124a may be obtained in the quartz crystal element 100.

The configurations of the first recess portion 131a, the second recess portion 132a, the third recess portion 131b, and the fourth recess portion 132b will be described.

When the first main surface 100A of the quartz crystal element 100 is viewed in plan, the first recess portion 131a extends from the outer side portion in the X-axis direction. The second recess portion 132a extends from the outer side portion in the Z'-axis direction. Only the tip portion of the first recess portion 131a overlaps with the second recess portion 132a in the X-axis direction, and the entirety of the first recess portion 131a does not overlap with the second recess portion 132a in the X-axis direction. That is, at least part of an opening end portion of the first recess portion 131a in the −X-axis direction side is arranged side by side with the connection portion 125 in the first direction D1 parallel to the X-axis direction. The tip portion of the first recess portion 131a in the +X-axis direction side is arranged side by side with the second recess portion 132a in the first direction D1 parallel to the X-axis direction. With this, in the quartz crystal element 100, the stress propagating from the holding region 120 to the main body region 110 is attenuated, and strain occurred in the central portion 111 may be reduced. Therefore, in the quartz crystal vibrator unit 1, even when the thermal stress is occurred in the first holding portion 121a due to the difference in the thermal expansion coefficient between the base member 30 and the quartz crystal element 100, it is possible to suppress the fluctuation of the vibration characteristics.

Note that the entirety of the first recess portion 131a may be arranged side by side with the second recess portion 132a in the first direction D1 parallel to the X-axis direction. In the quartz crystal element 100 with the above configuration, the stress propagating to the central portion 111 of the main body region 110 may be attenuated. However, the configuration in which only the tip portion of the first recess portion 131a is arranged side by side with the second recess portion 132a in the first direction D1 parallel to the X-axis direction is preferable in terms of vibration confinement in the thickness shear vibration mode, compared with the configuration in which the entirety of the first recess portion 131a is arranged side by side with the second recess portion 132a in the first direction D1.

The first recess portion 131a, the second recess portion 132a, and the main body region 110 are arranged in this order in the X-axis direction. That is, at least part of each of the first recess portion 131a and the second recess portion 132a is formed between the first holding portion 121a and the main body region 110. The second recess portion 132a is also formed closer to the main body region 110 than the first recess portion 131a. According to this configuration, compared with a configuration in which the second recess portion, the first recess portion, and the main body region are arranged in this order in the Z-axis direction, the quartz crystal element 100 may be reduced in size.

Both the first recess portion 131a and the second recess portion 132a are through-holes that penetrate through the quartz crystal element 100 along the Y'-axis direction. With this, in the quartz crystal element 100, the stress from the first holding portion 121a to the main body region 110 may be more effectively attenuated.

Note that at least one of the first recess portion and the second recess portion may be provided in a bottomed groove-like shape. The first recess portion and the second recess portion which are provided in the bottomed groove-like shape may have an opening on either side of the first main surface or the second main surface of the quartz crystal element. In a case where both the first recess portion and the second recess portion are provided in a bottomed groove-like shape, it is preferable that one have an opening on the first main surface, and the other have an opening on the second main surface. In such a quartz crystal element, the stress from the first holding portion to the main body region may be more effectively attenuated. Further, it is possible to suppress deterioration of balance between the mechanical strength against the deformation in the +Y'-axis direction and the mechanical strength against the deformation in the −Y'-axis direction of the quartz crystal element. In view of the attenuation of the stress propagating to the main body region 110, it is preferable that at least one of the first recess portion and the second recess portion be a through-hole.

When the first main surface 100A of the quartz crystal element 100 is viewed in plan, the first recess portion 131a extends and is inclined with respect to the X-axis direction. Specifically, the first recess portion 131a extends along the X-axis direction from the end portion of the holding region 120 on the −X-axis direction side extending along the Z'-axis direction toward the main body region 110. That is, the extending direction of the first recess portion 131a is a direction inclined with an angle smaller than 45° from a direction parallel to the X-axis direction. The first recess portion 131a extends in a direction inclined from the +X-axis direction to the +Z-axis direction side. That is, the first recess portion 131a extends from the center side of the holding region 120 in the Z'-axis direction toward the outer side portion. With this, in the quartz crystal element 100, a narrow path is formed in the propagation path of the stress, and the stress propagating to the main body region 110 may be attenuated. Note that the first recess portion may extend in the Z'-axis direction. That is, the extending direction of the first recess portion may be a direction inclined with an angle smaller than 45° from a direction parallel to the Z'-axis direction.

In the first main surface 100A of the quartz crystal element 100, the first recess portion 131a is formed so as to be narrower from the outer side portion toward the tip in the X-axis direction. With this, in the quartz crystal element 100, a narrow path is formed in the propagation path of the stress, and the stress propagating to the main body region 110 may be attenuated.

When the first main surface 100A of the quartz crystal element 100 is viewed in plan, the second recess portion 132a extends and is inclined with respect to the Z'-axis direction. Specifically, the second recess portion 132a extends along the X-axis direction of the holding region 120, and extends from the end portion of the +Z'-axis direction side, which is one of the pair of end portions opposing to each other in the Z'-axis direction, toward the connection portion 125 along the Z'-axis direction. That is, the second recess portion 132a forms a constricted shape in the connection portion 125. The extending direction of the second recess portion 132a is a direction inclined with an angle smaller than 45° from a direction parallel to the Z'-axis direction. The second recess portion 132a extends in a direction inclined from the -Z'-axis direction to the −X-axis direction side. The second recess portion 132a extends from a position, which is closer to the main body region 110 relative to the central portion in the X-axis direction, in the end portion of the holding region 120 along the X-axis direction. That is, the second recess portion 132a extends from the outer side portion of the holding region 120 in the X-axis direction toward the center side thereof. In other words, the second recess portion 132a is formed so as to be separated from the main body region 110 from the outer side portion toward the tip in the Z'-axis direction. With this, in the quartz crystal element 100, the stress is reflected and propagated toward the direction away from the main body region 110. For this reason, in the quartz crystal element 100, the stress propagating to the main body region 110 may be attenuated.

When the first main surface 100A of the quartz crystal element 100 is viewed in plan, the third recess portion 131b extends from the end portion of the holding region 120 in the −X-axis direction side, from the center side toward the outer side portion of the holding region 120 in the Z'-axis direction. The fourth recess portion 132b extends from the end portion of the holding region 120 in the −Z'-axis direction side, from the outer side portion (main body region 110 side) toward the center side of the holding region 120 in the X-axis direction. Then, the third recess portion 131b and the fourth recess portion 132b overlap with each other in the X-axis direction. The third recess portion 131b, the fourth recess portion 132b, and the main body region 110 are arranged in this order in the X-axis direction. The third recess portion 131b extends and is inclined with respect to the X-axis direction. The third recess portion 131b is formed so as to be narrower from the outer side portion toward the tip in the X-axis direction. The fourth recess portion 132b extends and is inclined with respect to the Z'-axis direction.

When the first main surface 100A of the quartz crystal element 100 is viewed in plan, the configuration of the third recess portion 131b and the fourth recess portion 132b and the configuration of the first recess portion 131a and the second recess portion 132a are line symmetry with the line passing through the connection portion 125 and parallel to the X-axis direction as the axis of symmetry. According to the third recess portion 131b and the fourth recess portion 132b, the same effect as the effect obtained by the first recess portion 131a and the second recess portion 132a may be obtained in the quartz crystal element 100.

Next, with respect to the dimensions and angles of the first recess portion 131a, the second recess portion 132a, the third recess portion 131b, and the fourth recess portion 132b when the first main surface 100A is viewed in plan, an example will be described.

The opening end portion of the first recess portion 131a and the third recess portion 131b of the −X-axis direction side has a width of approximately 100 µm along the Z'-axis direction. The first recess portion 131a has an end side having a length of approximately 65 µm inclining approximately 67° from the +Z'-axis direction to the +X-axis direction side, and an end side having a length of approximately 138 µm inclining approximately 28° from the +Z'-axis direction to the +X-axis direction side. The third recess portion 131b has an end side having a length of approximately 65 µm inclining approximately 67° from the −Z'-axis direction to the +X-axis direction side, and an end side having a length of approximately 138 µm inclining approximately 28° from the −Z'-axis direction to the +X-axis direction side.

The second recess portion 132a and the fourth recess portion 132b have a substantially rectangular shape having a width of about 20 µm and a length of about 100 µm. The second recess portion 132a and the fourth recess portion 132b are formed so as to be more distant from the main body region 110 as they approach the center from both outer side portions in the Z'-axis direction of the quartz crystal element 100. The extending direction of the second recess portion 132a from the end side of the quartz crystal element 100 is inclined approximately 10° from the −Z'-axis direction to the −X-axis direction side. The extending direction of the fourth recess portion 132b from the end side of the quartz crystal element 100 is inclined approximately 10° from the +Z'-axis direction to the −X-axis direction side.

Next, an electrode of the quartz crystal vibrator 10 will be described.

As illustrated in FIG. 4 and FIG. 5, the quartz crystal vibrator 10 includes a first excitation electrode 151a, a second excitation electrode 151b, a first extension electrode 152a, a second extension electrode 152b, a first connection electrode 153a, and a second connection electrode 153b.

The first excitation electrode 151a and the second excitation electrode 151b are provided so as to face each other across the main body region 110. The first excitation electrode 151a is provided in the inner side of the central portion 111 on the first main surface 100A side of the quartz crystal element 100. The second excitation electrode 151b is provided in the inner side of the central portion 111 on the second main surface 100B side of the quartz crystal element 100. When the first main surface 100A is viewed in plan, the first excitation electrode 151a and the second excitation electrode 151b are substantially rectangular, have substantially the same size, and overlap with each other over the entire area.

The first extension electrode 152a is electrically connected to the first excitation electrode 151a. The first extension electrode 152a is provided on the connection portion 125, the second arm portion 124a, and the first arm portion 123a which are portions of the beam portion 122, on the first main surface 100A side of the quartz crystal element 100. The second extension electrode 152b is electrically connected to the second excitation electrode 151b. The second extension electrode 152b is provided on the connection portion 125, the fourth arm portion 124b, and the third arm portion 123b which are portions of the beam portion 122, on the second main surface 100B side of the quartz crystal element 100. When the first main surface 100A of the quartz crystal element 100 is viewed in plan, the first extension electrode 152a and the second extension electrode 152b are provided so as not to overlap with each other. For example, when the first main surface 100A of the quartz crystal element 100 is viewed in plan, the first extension electrode 152a extends to an end portion of the connection portion 125 in the first holding portion 121a side, and the second extension electrode 152b extends to an end portion of the connection portion 125 in the second holding portion 121b side. At this time, the first extension electrode 152a and the second extension electrode 152b are arranged with a distance in the second direction D2. With this, in the quartz crystal vibrator 10, the stray capacitance formed between the first extension electrode 152a and the second extension electrode 152b may be reduced.

The first connection electrode 153a is electrically connected to the first excitation electrode 151a via the first extension electrode 152a. The first connection electrode 153a is provided on the surface of the first holding portion 121a. The second connection electrode 153b is electrically connected to the second excitation electrode 151b via the second extension electrode 152b. The second connection electrode 153b is provided on the surface of the second holding portion 121b.

As illustrated in FIG. 4, the first conductive holding member 36a is bonded to the first connection electrode 153a, and the second conductive holding member 36b is bonded to the second connection electrode 153b. The first conductive holding member 36a is provided in the outer side of the first recess portion 131a along the surface of the first holding portion 121a. The second conductive holding member 36b is provided in the outer side of the third recess portion 131b along the surface of the second holding portion 121b. With this, in the quartz crystal vibrator 10, it is possible to inhibit the formation of stray capacitance between the first conductive holding member 36a and the first extension electrode 152a. It is also possible to inhibit the formation of the floating capacitance between the second conductive holding member 36b and the second extension electrode 152b. Further, in the quartz crystal vibrator 10, it is possible to prevent the case that the first recess portion 131a is filled with the first conductive holding member 36a and the first holding portion 121a and the second arm portion 124a are connected by the first conductive holding member 36a. Similarly, the second holding portion 121b and the fourth arm portion 124b are prevented from being connected by the second conductive holding member 36b.

Note that part of the first conductive holding member may enter the inside of the first recess portion. With this, the bonding area between the first conductive holding member and the quartz crystal vibrator increases. Therefore, the bonding strength between the quartz crystal vibrator and the first conductive holding member is improved, and the mounting posture of the quartz crystal vibrator with respect to the base member is stabilized. In the quartz crystal vibrator having a configuration in which part of the first conductive holding member enters the inside of the first recess portion, it is required that the first conductive holding member be separated from the second arm portion. Similarly, when the second conductive holding member is separated from the third arm portion, part of the second conductive holding member may enter the third recess portion.

Next, the configuration of the main body region 110 in sectional view will be described.

As illustrated in FIG. 5, the central portion 111 has a first front surface 111A in the first main surface 100A side of the quartz crystal element 100, and has a first back surface 111B in the second main surface 100B side of the quartz crystal element 100. The peripheral portion 113 has a second front surface 113A in the first main surface 100A side of the quartz crystal element 100, and has a second back surface 113B in the second main surface 100B side of the quartz crystal element 100. The first front surface 111A, the first back surface 111B, the second front surface 113A, and the second back surface 113B are surfaces parallel to the main surface of the quartz crystal element 100 and are parallel to the X-axis direction and the Z'-axis direction. The main body region 110 has a first side surface 112A that connects the first front surface 111A of the central portion 111 and the second front surface 113A of the peripheral portion 113, in the first main surface 100A side of the quartz crystal element 100. The main body region 110 has a second side surface 112B that connects the first back surface 111B of the central portion 111 and the second back surface 113B of the peripheral portion 113, in the second main surface 100B side of the quartz crystal element 100.

As in the SEM image having a magnification of 1500 times illustrated in FIG. 6, in sectional view along the second direction D2 of the main body region 110, the end surface of the peripheral portion 113 has a first end surface 113C and a second end surface 113D. The first end surface 113C corresponds to a crystal plane substantially orthogonal to the second main surface 100B of the quartz crystal element 100. It is preferable that the first end surface 113C be a surface inclined with an angle within ±10° from the direction orthogonal to the second back surface 113B, and more preferably, a surface inclined with an angle within ±5°. For example, the first end surface 113C is inclined with an angle of approximately 3° from a direction orthogonal to the second back surface 113B. The second end surface 113D corresponds to an inclined surface connecting the second front surface 113A and the first end surface 113C. At least part of the second end surface 113D has a curved shape. The shape of the end surface illustrated in FIG. 6 is formed as follows. The contour of the AT-cut quartz crystal plate is processed by wet etching without any mask deviation between the front and back sides, and then the mesa shape is formed by wet etching process.

Compared with a configuration in which the end surface of the peripheral portion 113 has an inclined surface connected to the second front surface 113A and an inclined surface connected to the second back surface 113B, the inclined surface of the peripheral portion 113 may be made smaller when the first main surface 100A is viewed in plan in the quartz crystal element 100. In other words, in the quartz crystal element 100, the end portion of the central portion 111 may be brought close to the end surface of the peripheral portion 113. That is, in the quartz crystal element 100, the ratio of the central portion 111 to the main body region 110 increases, and the ratio of the peripheral portion 113 to the main body region 110 decreases. Expressing with the width along the second direction D2, the ratio of the width W2 of the central portion 111 to the width W1 of the main body region 110 (W2/W1) may be increased. At this time, by increasing the ratio of the width W3 of the first excitation electrode 151a to the width W2 of the central portion 111 (W3/W2), the area of the portion contributing to the vibration in the main body region 110 may be increased.

In the graph described in FIG. 7, the horizontal axis represents W2/W1, and the vertical axis represents the CI value. By an increase of W2/W1, the CI value of the quartz crystal vibrator 10 may be reduced. That is, it is possible to reduce power consumption of the quartz crystal vibrator 10. It is preferable that W2/W1 be 60% or more, and W3/W2 be 90% or more. With this, in the quartz crystal vibrator 10, the CI value may be sufficiently reduced, and the power consumption may be reduced. As illustrated in FIG. 6, the width W1 is a distance between the first end surfaces 113C opposing to each other in the second direction D2. The width W2 is a dimension along the second direction D2 of the first front surface 111A of the central portion 111. Further, the width W3 is a dimension of the first excitation electrode 151a along the second direction D2.

Next, an example of the dimensions of the quartz crystal vibrator 10, when the first main surface 100A is viewed in plan, will be described.

The quartz crystal element 100 has a dimension of approximately 766 μm in the first direction D1 that passes through the center of the central portion 111 and is parallel to the X-axis direction, and has a dimension of approximately 683 μm in the second direction D2 that passes through the center of the central portion 111 and the connection portion 125 and is parallel to the Z'-axis direction. Each of the first excitation electrode 151a and the second excitation electrode 151b has a dimension of approximately 668 μm in the first direction D1 parallel to the X-axis direction and a dimension of approximately 569 μm in the second direction D2 parallel to the Z'-axis direction. The dimension in the first direction D1 passing through the first holding portion 121a and parallel to the X-axis direction is larger than the dimension in the first direction D1 passing through the center of the central portion 111 and parallel to the X-axis direction. Specifically, the first holding portion 121a has a protruding portion protruding in the −X-axis direction compared with the end side of the beam portion 122 that is provided on the −X-axis direction side and extends in the Z'-axis direction. The protruding portion of the first holding portion 121a has, for example, a substantially rectangular shape. The protruding portion of the first holding portion 121a has a dimension of approximately 30 μm in a first direction D1 parallel to the X-axis direction and a dimension of approximately 60 μm in a second direction D2 parallel to the Z'-axis direction. The second holding portion 121b has a similar protruding portion. The shapes and dimensions of the protruding portion of the second holding portion 121b are the same as the shapes and dimensions of the protruding portion of the first holding portion 121a.

Next, the operation of the quartz crystal vibrator 10 will be described.

In the quartz crystal vibrator 10, an alternating electric field is generated by a driving signal (alternating voltage) applied from the outside to the first excitation electrode 151a and the second excitation electrode 151b via the first conductive holding member 36a and the second conductive holding member 36b. Then, in the quartz crystal vibrator 10, various vibrations, in which the thickness shear vibration mode is the main vibration, are excited by the piezoelectric effect of the quartz crystal element 100.

Note that the vibration (driving) method of the vibrator according to an embodiment of the present invention is not limited to the piezoelectric driving. For example, the vibrator according to an embodiment of the present invention may be a vibrator such as an electrostatic driving type using electrostatic force or a Lorentz driving type using magnetic force, in addition to a piezoelectric driving type using a piezoelectric substrate.

WORKING EXAMPLE AND COMPARATIVE EXAMPLE

Figure 8:
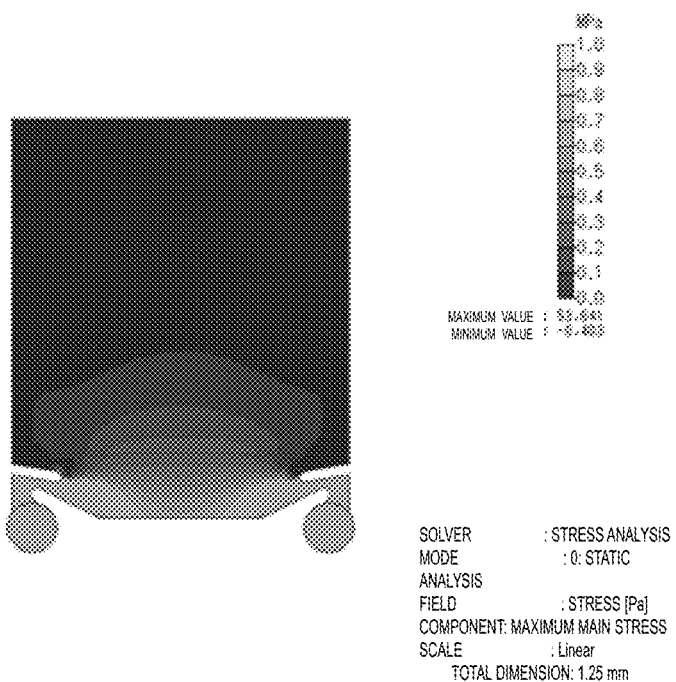
FIG. 8 is a diagram illustrating a simulation result of stress propagation in a working example.
Figure 9:
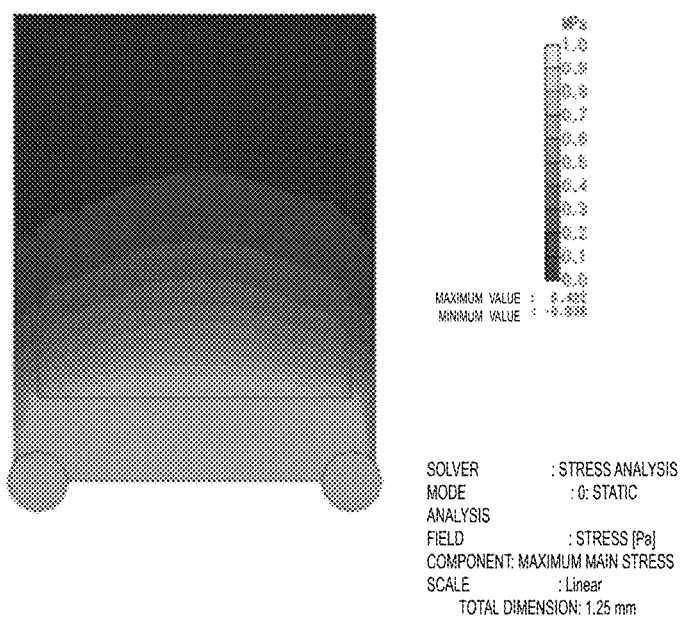
FIG. 9 is a diagram illustrating a simulation result of stress propagation in a comparative example.

Next, with reference to FIG. 8 and FIG. 9, a working example and a comparative example of a quartz crystal vibrator according to the first embodiment will be described. The working example and the comparative example are simulation evaluation results under conditions in which the mesh size is 0.01 mm and the temperature is changed from 200° C. to 25° C. in the stress analysis solver. Femtet (registered trademark) which is software developed by Murata Manufacturing Co., Ltd is used for the simulation evaluation. FIG. 8 is a diagram illustrating a simulation result of stress propagation in the working example. FIG. 9 is a diagram illustrating a simulation result of stress propagation in the comparative example. In the simulation illustrated in FIG. 9, a quartz crystal vibrator having a flat plate shaped holding region, in which no recess portion is formed, is evaluated as the comparative example.

In the comparative example, the stress propagates to the central portion of the main body region, whereas in the working example, the stress propagates to the end portion in the holding region side of the main body region and stops. Further, it was found that the stress propagating to the central portion of the main body region in the working example is smaller than the stress propagating to the central portion of the main body region in the comparative example.

Second Embodiment

Figure 10:
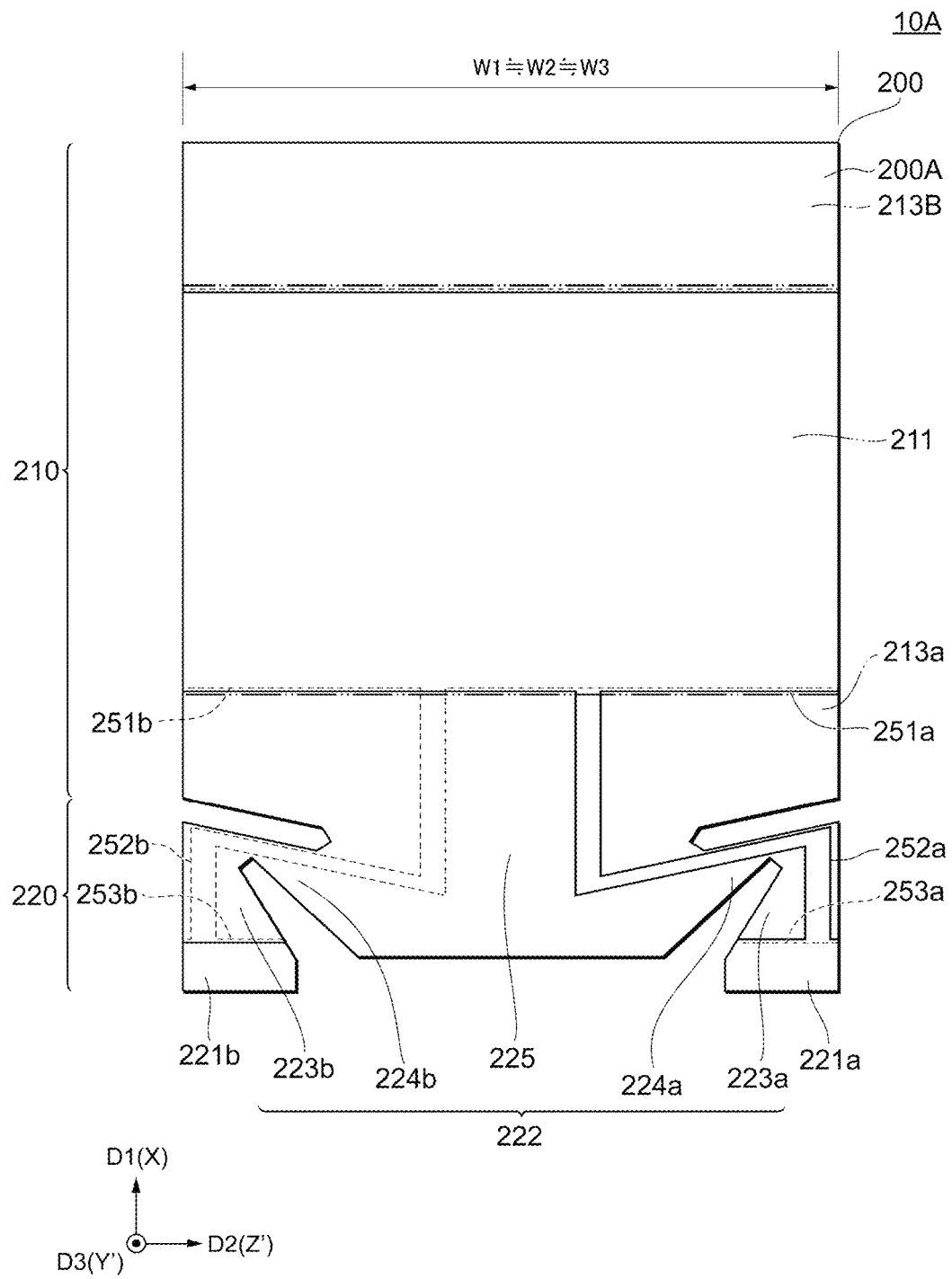
FIG. 10 is a plan view schematically illustrating a configuration of a quartz crystal vibrator according to a second embodiment.
Figure 11:
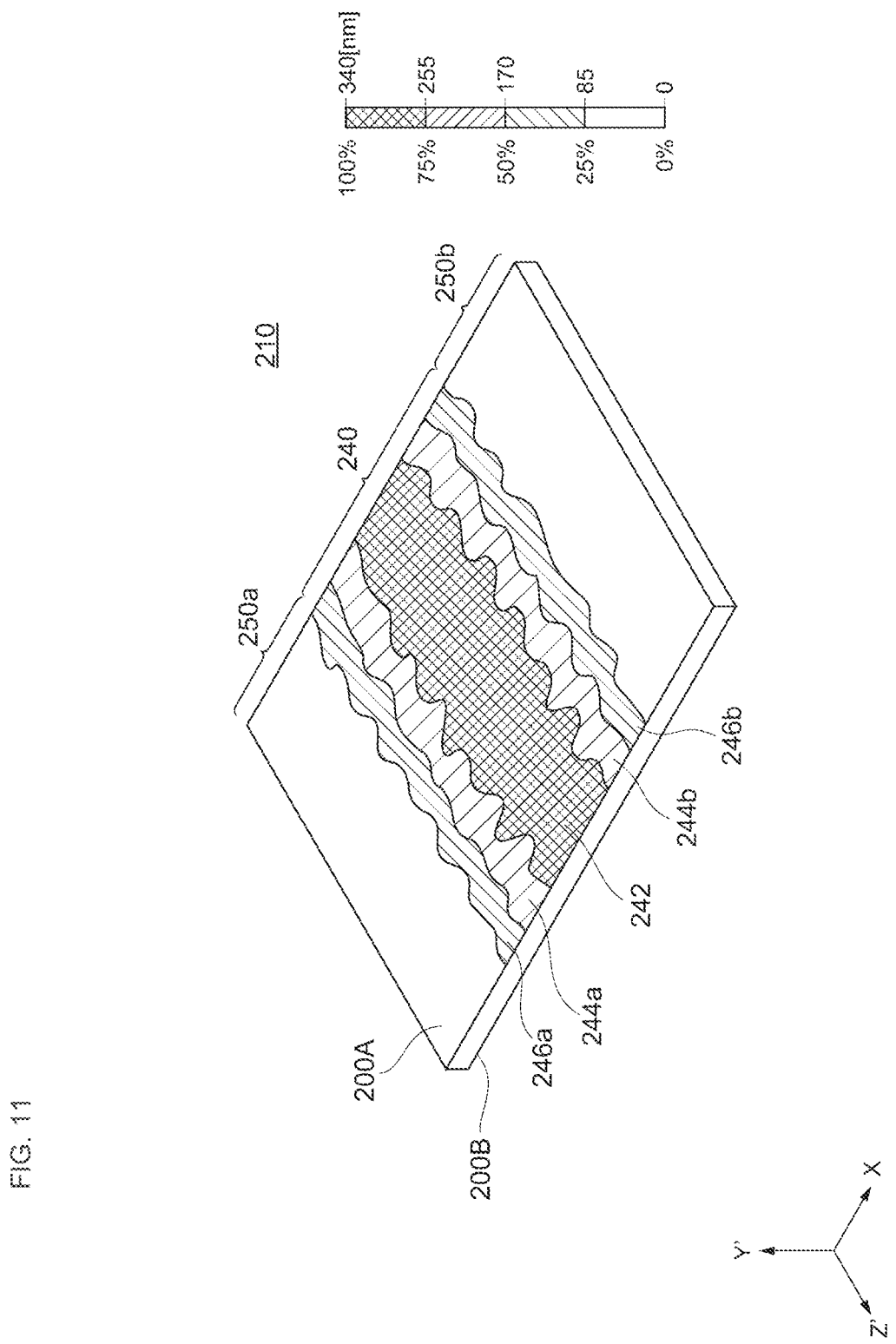
FIG. 11 is a diagram illustrating a vibration distribution of thickness shear vibration in a main body region of a quartz crystal element illustrated in FIG. 10.
Figure 12:
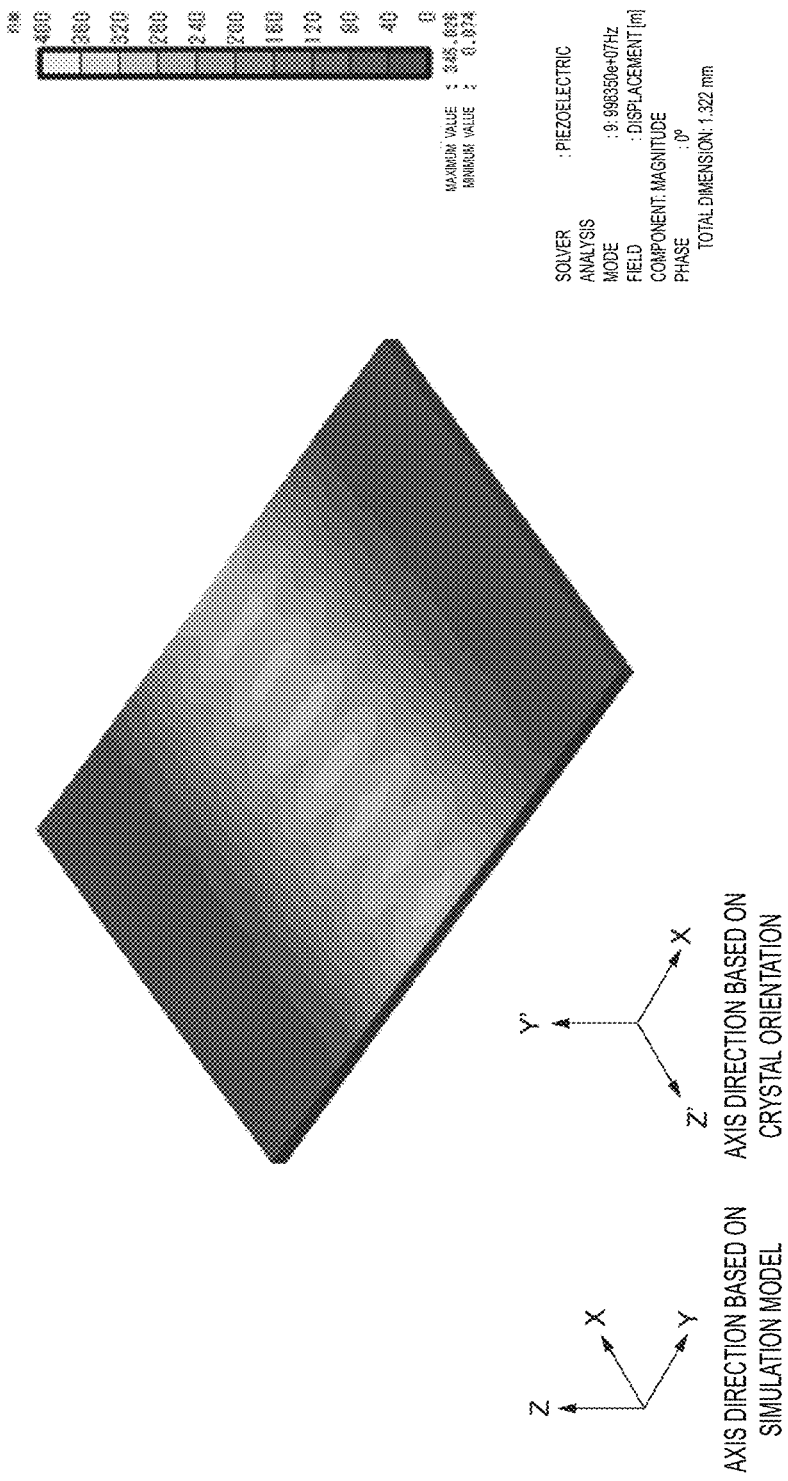
FIG. 12 is a diagram illustrating a simulation result of the vibration distribution in the main body region of the quartz crystal element illustrated in FIG. 10.

Next, with reference to FIG. 10 to FIG. 12, a working example and a comparative example of a quartz crystal vibrator 10A according to a second embodiment will be described. FIG. 10 is a plan view schematically illustrating a configuration of a quartz crystal vibrator according to the second embodiment. FIG. 11 is a diagram illustrating a vibration distribution of the thickness shear vibration in the main body region of the quartz crystal element illustrated in FIG. 10. FIG. 12 is a diagram illustrating a simulation result of vibration distribution in the main body region of the quartz crystal element illustrated in FIG. 10.

Similarly to the quartz crystal vibrator 10 according to the first embodiment, the quartz crystal vibrator 10A according to the second embodiment includes a quartz crystal element 200 including a main body region 210 and a holding region 220. The main body region 210 includes a central portion 211 and peripheral portions 213a and 213b. The holding region 220 includes a first holding portion 221a, a second holding portion 221b, and a beam portion 222. The beam portion 222 includes a first arm portion 223a, a second arm portion 224a, a third arm portion 223b, a fourth arm portion 224b, and a connection portion 225. In addition, similarly to the quartz crystal vibrator 10, the quartz crystal vibrator 10A includes a first excitation electrode 251a, a second excitation electrode 251b, a first extension electrode 252a, a second extension electrode 252b, a first connection electrode 253a, and a second connection electrode 253b.

The crystal vibrator 10A according to the second embodiment differs from the quartz crystal vibrator 10 according to the first embodiment in that the main body region 210 has a flat plate shape, and the central portion 211 is provided in a band shape over the entire width along the second direction D2 of the main body region 210. That is, the thickness of the central portion 211 along the Y'-axis direction is substantially equal to the thickness of the peripheral portions 213a and 213b along the Y'-axis direction. Further, the central portion 211 extends along the X-axis direction of the main body region 210 and is provided up to a pair of end sides opposing to each other in the Z'-axis direction. The first excitation electrode 251a and the second excitation electrode 251b are provided in a band shape over the entire width along the second direction D2 of the central portion 211. That is, the first excitation electrode 251a and the second excitation electrode 251b extend along the X-axis direction of the central portion 211 and are provided up to a pair of end sides opposing to each other in the Z'-axis direction. In other words, when the first main surface 200A of the quartz crystal element 200 is viewed in plan, the end side of the first excitation electrode 251a in the +Z'-axis direction side overlaps with the end side of the quartz crystal element 200 in the +Z'-axis direction side, and the end side of the first excitation electrode 251a in the −Z'-axis direction side overlaps with the end side of the quartz crystal element 200 in the −Z'-axis direction side. Therefore, a width W1 of the main body region 210 is substantially equal to a width W2 of the central portion 211, and is substantially equal to a width W3 of the first excitation electrode 251a. The peripheral portion 213a is provided in the holding region 220 side of the central portion 211, and the peripheral portion 213b is provided in the side of the central portion 211 opposite to the holding region 220.

FIG. 12 is a simulation result of the thickness shear vibration when an alternating electric field with predetermined oscillation frequency, for example, AT-cut basic oscillation frequency is applied to the quartz crystal vibrator 10A of FIG. 10. The simulation is performed by the piezoelectric analysis solver under the condition of mesh size of 0.02 mm using Femtet (registered trademark) which is software developed by Murata Manufacturing Co., Ltd., and FIG. 11 is a schematic diagram thereof. The material constants were cited from Handbook of Chemistry, Pure Chemistry, 4th ed., The Chemical Society of Japan, Maruzen Co., Ltd. (1993); Chronological Scientific Tables, National Astronomical Observatory of Japan, 1996, Maruzen Co., Ltd. (1993); Acoustic Wave Device Technology Handbook, Japan Society for the Promotion of Science, Acoustic Wave Device Technology 150 Committee, Ohmsha, Ltd.; and Surface Acoustic Wave Device Material Data Book, Japan Electronics and Information Technology Industries Association.

As illustrated in FIG. 11 and FIG. 12, the distribution of the vibration, of which main vibration is the thickness shear vibration mainly vibrating in the X-axis direction of the quartz crystal vibrator 10A, has a vibration region 240 extending in a band shape in the Z'-axis direction of the quartz crystal element 200, and non-vibration regions 250a and 250b that are respectively adjacent to each side of the vibration region 240 in the X-axis direction of the quartz crystal element 200. That is, the non-vibration region 250a and the non-vibration region 250b are not adjacent to each other. Here, in the present embodiment, the vibration region refers to a region where a substantial displacement occurs in the quartz crystal element by the main vibration which is the thickness shear vibration when the alternating electric field of the predetermined oscillation frequency, for example, the AT-cut basic oscillation frequency is applied. In addition, in the present embodiment, the non-vibration region refers to a region where a substantial displacement does not occur in the quartz crystal element when the vibration region of the quartz crystal element vibrates by the main vibration, and is not limited to a region where there is no displacement by the vibration, and includes a region where the displacement by the vibration is smaller than that in the vibration region. Note that the non-vibration region is a region in which the displacement amount is preferably less than 25%, and more preferably less than 20% of the maximum displacement amount. In addition, when the XZ' plane is viewed in plan, the vibration region 240 has a band shape continuing from one end side of the main body region 210 parallel to the X-axis to the other end side of the main body region 210 also parallel to the X-axis. Note that the vibration region 240 does not reach any of two end sides parallel to the Z'-axis of the main body region 210. When the XZ' plane is viewed in plan, the boundaries between the vibration region 240 and the non-vibration regions 250a and 250b are each not a straight line, but each have a wave shape in which peaks and valleys are alternately repeated. The wave shape boundary has a substantially sinusoidal shape with substantially constant period in which the height of the peak and the depth of the valley are substantially equal to each other, for example. At this time, when the center portion of the peak and the valley is taken as a reference, the difference in the magnitude of the depth of the valley with respect to the magnitude of the height of the peak is preferably within ±25%. In the case where the vibration region 240 extends in a band shape, it is sufficient that the vibration region 240 extends in a certain direction with a certain width, the vibration region 240 is not limited to be elongated in the extending direction, and an aspect is included in which the length in the extending direction is smaller than the width, for example.

Here, the vibration region 240 may substantially coincide with the region overlapping with the first excitation electrode 251a in FIG. 10 when the XZ' plane is viewed in plan. In this case, the vibration region 240 has a band shape extending from one end side of the first excitation electrode 251a parallel to the X-axis to the other end side of the first excitation electrode 251a also parallel to the X-axis. Further, the boundary where the vibration region 240 and the non-vibration regions 250a and 250b are adjacent to each other has a wave shape as described above, but substantially coincides with the end side of the first excitation electrode 251a parallel to the Z'-axis.

FIG. 11 illustrates the displacement distribution at the moment when the vibration of the first main surface 200A marks the maximum displacement in the configuration of FIG. 10. The vibration region 240 is equally divided into four with the maximum displacement value being the reference. The vibration region 240 is divided into three vibration regions and one non-vibration region and the vibration regions are indicated by using different types of hatching. That is, the vibration region 240 has a first vibration intensity region 242, a second vibration intensity regions 244a and 244b of which displacement amount of vibration is smaller than that of the first vibration intensity region 242, and a third vibration intensity regions 246a and 246b of which displacement amount of vibration is smaller than that of the second vibration intensity regions 244a and 244b. When the XZ' plane is viewed in plan, the second vibration intensity regions 244a and 244b are respectively adjacent to each side of the first vibration intensity region 242 in the X-axis direction of the main body region 210. In addition, the third vibration intensity regions 246a and 246b are respectively adjacent to the sides of the second vibration intensity regions 244a and 244b, the sides which are not adjacent to the first vibration intensity region 242, in the X-axis direction of the main body region 210. In other words, when a center line parallel to the Z'-axis is drawn in the center of the first vibration intensity region 242, the vibration region 240 has a line symmetric vibration distribution with the center line as the reference. Then, the non-vibration region 250a and 250b, in which the displacement amount illustrated in FIG. 11 is 0% to 25% of the maximum displacement amount and is in a range from 0 nm to 85 nm, is adjacent to the sides of the third vibration intensity regions 246a and 246b, the sides which are not adjacent to the second vibration intensity regions 244a and 244b, in the X-axis direction of the main body region 210. In the examples illustrated in FIG. 11 and FIG. 12, the displacement amount of the first vibration intensity region 242 is 75% to 100% of the maximum displacement amount and is approximately 255 nm to 340 nm, the displacement amounts of the second vibration intensity regions 244a and 244b are 50% to 75% of the maximum displacement amount and are approximately 170 nm to 255 nm, and the displacement amounts of the third vibration intensity regions 246a and 246b are 25% to 50% of the maximum displacement amount and approximately 85 nm to 170 nm. Each of the vibration intensity regions has a band like shape that continues from one end side of the main body region 210 parallel to the X-axis to the other long side of the main body region 210 also parallel to the X-axis when the XZ' plane is viewed in plan. Note that each of the vibration intensity regions does not reach any of two short sides of the quartz crystal element 200 parallel to the Z'-axis. Further, the boundaries, in which the respective vibration intensity regions are adjacent to each other, are not straight lines and meander in a wave shape. The boundaries in a wave shape form a substantially sinusoidal shape, for example.

Further, the vibration region 240 includes a strong vibration region (including the apex of the vibration) indicating a displacement amount of 90% or more of the maximum displacement amount. For example, as illustrated in FIG. 11 and FIG. 12, the first vibration intensity region 242 in the vibration region 240 includes the strong vibration region. As illustrated in FIG. 12, the strong vibration region includes first distributions with opposite phase to each other which locate in one end side on the front surface of the main body region 210 extending in the X-axis direction, and locate in the other end side on the back surface of the main body region 210 extending in the X-axis direction. The other end side is apart from the one end side in the Z'-axis direction and is opposing to the one end side. The first distribution is a semielliptical distribution in which an ellipse having a major axis along the X-axis direction of the main body region 210 is divided into longitudinal halves. Further, the strong vibration region has second distributions that are located on each of the front surface and the back surface of the main body region 210, and are arranged side by side in the Z'-axis direction. The second distribution is a substantially elliptical distribution having a major axis along the X-axis direction of the main body region 210 as illustrated in FIG. 12. As described above, the first vibration intensity region 242 in FIG. 11 has a plurality of strong vibration regions along the Z'-axis direction. In FIG. 11, an outer edge of the first vibration intensity region 242 including a plurality of strong vibration regions is illustrated.

In summary, the first excitation electrode 251a and the second excitation electrode 251b are configured to excite the thickness shear vibration having the main vibration in the first direction D1 when the alternating electric field is applied. Further, the distribution of vibration in the quartz crystal element 200, in which the thickness shear vibration is the main vibration, has the vibration region 240 extending in the band shape in the Z'-axis direction of the quartz crystal element 200 and the non-vibration regions 250a and 250b respectively adjacent to each side of the vibration region 240 in the Z-axis direction of the quartz crystal element 200.

Further, the vibration distribution of the thickness shear vibration in the quartz crystal element 200, of which main vibration is in the first direction D1 and is excited by the first excitation electrode 251a and the second excitation electrode 251b, extends across the two end sides of the quartz crystal element 200 opposing to each other in the Z'-axis direction. The vibration distribution has nodes of amplitude in the two second vibration intensity regions 244a and 244b, which are provided opposing to each other with a distance in the X-axis direction, and an antinode of amplitude in the first vibration intensity region 242 provided in a position sandwiched by the two nodes.

In addition, the first excitation electrode 251a and the second excitation electrode 251b are respectively provided such that the main body region 210 includes a vibration region 240 which is located at the central portion in the X-axis direction and vibrates by at least the thickness shear vibration, and non-vibration regions 250a and 250b which sandwich the vibration region 240 at both sides in the X-axis direction. The boundaries between the vibration region 240 and the non-vibration regions 250a and 250b connect the two end sides extending in the X-axis direction and opposing to each other in the Z'-axis direction of the main body region 210 and extend in a wave shape in the Z'-axis direction.

Further, the strong vibration region in the vibration region 240 includes first distributions with opposite phases each other which locate in one end side of the front surface of the main body region 210 extending in the X-axis direction and locate in the other end side of the back surface extending in the X-axis direction. The other end side is apart from the one end side in the Z'-axis direction and is opposing to the one end side.

Hereinafter, part or all of the embodiments of the present invention will be described. Note that the present invention is not limited to the following supplementary notes.

According to an aspect of the present invention, there is provided a vibration substrate that has a main surface parallel to a first direction and a second direction orthogonal to each other, including; a main body region including a vibrating portion at least in a part thereof; and at least one holding region arranged side by side with the main body region in the first direction. The at least one holding region includes a holding portion for holding the vibration substrate and a beam portion for connecting the holding portion and the main body region. The beam portion includes a first arm portion extending from the holding portion along the first direction, a second arm portion extending along the second direction from an end portion of the holding portion on a side opposite to the first arm portion, and a connection portion for connecting the second arm portion and the main body region.

The first arm portion may extend from the holding portion toward the main body region.

The first arm portion may become narrower from the holding portion toward the second arm portion.

The second arm portion may become narrower from the connection portion toward the first arm portion.

When the main surface is viewed in plan, the extension direction of the second arm portion may be inclined with respect to the extending direction of the first arm portion.

When the main surface is viewed in plan, the angle formed by the extending direction of the second arm portion and the extending direction of the first arm portion may be an acute angle at the inner side of the vibration substrate in the second direction.

According to another aspect of the present invention, there is provided a vibration substrate that has a main surface parallel to a first direction and a second direction orthogonal to each other, including; a main body region including a vibrating portion at least in a part thereof; and at least one holding region arranged side by side with the main body region in the first direction. The at least one holding region includes a holding portion for holding the vibration substrate, a first recess portion extending from the outer side portion along the first direction and a second recess portion extending from the outer side portion along the second direction are formed in the holding region, and the first recess potion and the second recess portion overlap with each other in the first direction.

The first recess portion, the second recess portion, and the main body region may be arranged in this order in the first direction.

At least either of the first recess portion and the second recess portion may be a through-hole penetrating along a direction orthogonal to the main surface.

In a plan view of the main surface, the first recess portion may extend and be inclined with respect to the first direction.

In a plan view of the main surface, the second recess portion may extend and be inclined with respect to the second direction.

The first recess portion may be formed in the main surface so as to be narrower from the outer side portion toward the tip along the first direction.

The vibration substrate may be a piezoelectric substrate.

A vibrator may be provided that includes a vibration substrate constituted of quartz crystal having a predetermined crystal orientation, and a first excitation electrode and a second excitation electrode facing each other with the main body region interposed therebetween.

The vibrator may further include a first extension electrode electrically connected to the first excitation electrode, and a second extension electrode electrically connected to the second excitation electrode.

The holding portion includes a first holding portion and a second holding portion, the first holding portion may be provided with a first connection electrode electrically connected to the first excitation electrode via the first extension electrode, and the second holding portion may be provided with a second connection electrode electrically connected to the second excitation electrode via the second extension electrode.

The main body region includes a central portion including the center of the main surface and a peripheral portion adjacent to the central portion, and the peripheral portion may have a thickness smaller than that of the central portion.

The vibration substrate is formed of an AT-cut quartz crystal, the peripheral portion may be arranged adjacent to the central portion in sectional view in the second direction, an end surface of the peripheral portion is formed by a crystal plane substantially orthogonal to the main surface and an inclined surface connected to the crystal plane. The ratio of the width of the central portion along the second direction to the width of the main body region along the second direction may be 60% or more, and a ratio of the width of the first excitation electrode along the second direction to the width of the central portion along the second direction may be 90% or more.

The first excitation electrode and the second excitation electrode are configured to excite the thickness shear vibration having the main vibration in the first direction when the alternating electric field is applied. The distribution of the vibration of which main vibration is the thickness shear vibration in the vibration substrate may include a vibration region extending in a band shape in the second direction of the vibration substrate and non-vibration regions adjacent to the vibration region on both sides in the first direction of the vibration substrate.

The distribution of the thickness shear vibration having the main vibration in the first direction in the vibration substrate and excited by the first excitation electrode and the second excitation electrode may have two nodes of amplitude that extend so as to cross the two sides of the vibration substrate opposing to each other in the second direction and are provided so as to oppose to each other with a distance in the first direction, and an antinode of the amplitude of the vibration region provided in a position sandwiched by the two nodes of the amplitude.

The first excitation electrode and the second excitation electrode are respectively provided such that the main body region includes a vibration region locating at the central portion in the first direction and vibrating at least in the thickness shear vibration, and non-vibration regions sandwiching the vibration region on both sides in the first direction. The boundaries between the vibration region and the non-vibration regions may connect two sides of the vibration substrate extending in the first direction and opposing to each other in the second direction, and may extend in a wave shape in the second direction.

The strong vibration region in the vibration region may include first distributions with opposite phases each other which locate in one side of a front surface of the vibration substrate extending in the first direction, and another side of a back surface extending in the first direction. The other side is apart from the one side in the second direction and is opposing to the one side.

There may be provided a vibrator unit that includes a vibrator and a conductive holding member bonded to the holding portion of the vibration substrate to hold the vibration substrate, and supplies an alternating voltage to the main body region by being electrically connected to the vibration substrate.

The vibrator unit may further include a base member on which the vibrator is mounted with the conductive holding member.

The vibrator unit may further include a lid member that forms an internal space for accommodating the vibrator between the base member and the lid member.

The vibrator unit may further include a bonding member that bonds the base member and the lid member, and seals the internal space.

As described above, according to one aspect of the present invention, it is possible to provide a vibration substrate, a vibrator, and a vibrator unit which are capable of improving the stability of vibration characteristics.

The embodiments described above are intended to facilitate understanding of the present invention, and are not intended to limit the present invention. The present invention may be modified and/or improved without departing from the gist thereof, and the present invention also includes equivalents thereof. In other words, products achieved by design change on the aforementioned embodiments carried out appropriately by those skilled in the art are also included in the scope of the present invention as long as the products are provided with the features of the present invention. For example, the elements included in each embodiment and the arrangement, the material, the condition, the shape, the size, and the like thereof are not limited to the examples described above, and may be appropriately changed. Furthermore, the elements included in each embodiment may be combined as technically possible, and the combinations thereof are also included in the scope of the present invention as long as they include the features of the present invention.

REFERENCE SIGNS LIST

1 QUARTZ CRYSTAL VIBRATOR UNIT (VIBRATOR UNIT)
10 QUARTZ CRYSTAL VIBRATOR (VIBRATOR)
100 QUARTZ CRYSTAL ELEMENT (VIBRATION SUBSTRATE)
100A FIRST MAIN SURFACE
100B SECOND MAIN SURFACE
110 MAIN BODY REGION
111 CENTRAL PORTION
113 PERIPHERAL PORTION
120 HOLDING REGION
121a FIRST HOLDING PORTION
121b SECOND HOLDING PORTION
122 BEAM PORTION
123a FIRST ARM PORTION
124a SECOND ARM PORTION
123b THIRD ARM PORTION
124b FOURTH ARM PORTION
131a FIRST RECESS PORTION
132a SECOND RECESS PORTION
131b THIRD RECESS PORTION
132b FOURTH RECESS PORTION
30 BASE MEMBER
33a FIRST ELECTRODE PAD
33b SECOND ELECTRODE PAD
36a FIRST CONDUCTIVE HOLDING MEMBER
36b SECOND CONDUCTIVE HOLDING MEMBER
50 LID MEMBER
70 BONDING MEMBER

The invention claimed is:

1. A vibration substrate having a main surface that extends parallel to a first direction and a second direction, the first direction and the second direction being orthogonal to each other, the vibration substrate comprising:
   a main body region including a vibrating portion at least in a part of the main body region; and
   at least one holding region arranged side by side with the main body region along the first direction, the at least one holding region including:
   a holding portion; and
   a beam portion connecting the holding portion to the main body region, wherein the beam portion includes a first arm portion extending from the holding portion along the first direction, a second arm portion extending along the second direction from an end portion of the first arm portion on a side thereof opposite to the holding portion, and a connection portion connecting the second arm portion and the main body region.

2. The vibration substrate according to claim 1, wherein the first arm portion extends from the holding portion toward the main body region.

3. The vibration substrate according to claim 1, wherein the first arm portion narrows in a direction from the holding portion toward the second arm portion.

4. The vibration substrate according to claim 1, wherein the second arm portion narrows in a direction from the connection portion toward the first arm portion.

5. The vibration substrate according to claim 1, wherein when the main surface is viewed in a plan view thereof, an extending direction of the second arm portion is inclined with respect to an extending direction of the first arm portion.

6. The vibration substrate according to claim 5, wherein when the main surface is viewed in plan, an angle formed by the extending direction of the second arm portion and the extending direction of the first arm portion is an acute angle inside the vibration substrate in the second direction.

7. The vibration substrate according to claim 1, wherein the vibration substrate is a piezoelectric substrate.

8. A vibrator, comprising:
   the vibration substrate according to claim 1, wherein the vibration substrate comprises a quartz crystal having a predetermined crystal orientation; and a first excitation electrode and a second excitation electrode facing each other with the main body region interposed therebetween.

9. The vibrator according to claim 8, further comprising:
a first extension electrode electrically connected to the first excitation electrode and a second extension electrode electrically connected to the second excitation electrode.

10. The vibrator according to claim 9, wherein the holding portion is a first holding portion and the holding region includes a second holding portion, the vibrator further comprising:
a first connection electrode electrically connected to the first excitation electrode via the first extension electrode; and
a second connection electrode electrically connected to the second excitation electrode via the second extension electrode.

11. The vibrator according to claim 8,
wherein the main body region includes a central portion including a center of the main surface and a peripheral portion adjacent to the central portion, and
the peripheral portion has a thickness smaller than a thickness of the central portion.

12. The vibrator according to claim 11,
wherein the vibration substrate comprises an AT-cut quartz crystal,
the peripheral portion is adjacent to the central portion in a sectional view along the second direction,
an end surface of the peripheral portion is formed by a crystal plane orthogonal to the main surface and an inclined surface connected to the crystal plane,
a ratio of a width of the central portion along the second direction to a width of the main body region along the second direction is 60% or more, and
a ratio of a width of the first excitation electrode along the second direction to a width of the central portion along the second direction is 90% or more.

13. The vibrator according to claim 8,
wherein the first excitation electrode and the second excitation electrode are configured to excite a thickness shear vibration having a main vibration in the first direction when an alternating electric field is applied thereto, and
a distribution of a vibration in which a main vibration is the thickness shear vibration in the vibration substrate includes a vibration region extending in a band shape in the second direction of the vibration substrate and non-vibration regions respectively adjacent to the vibration region on opposed sides thereof along the first direction of the vibration substrate.

14. The vibrator according to claim 8,
wherein a vibration distribution of a thickness shear vibration having a main vibration in the first direction in the vibration substrate and excited by the first excitation electrode and the second excitation electrode has two nodes of amplitude that extend so as to cross two sides of the vibration substrate opposing each other along the second direction, and an antinode of the amplitude of a vibration region in a position sandwiched by the two nodes of the amplitude.

15. The vibrator according to claim 8,
wherein the first excitation electrode and the second excitation electrode are respectively provided such that the main body region includes a vibration region located at a central portion in the first direction and vibrating at least in a thickness shear vibration, and non-vibration regions sandwiching the vibration region on opposed sides thereof along the first direction, and
boundaries between the vibration region and the non-vibration regions connect two sides of the vibration substrate extending along the first direction and opposing each other along the second direction, and extend in a wave shape along the second direction.

16. A vibrator unit, comprising:
the vibrator according to claim 8; and
a conductive holding member bonded to the holding portion of the vibration substrate, and electrically connected to the vibration substrate.

17. The vibrator unit according to claim 16, further comprising:
a base member on which the vibrator is mounted with the conductive holding member.

18. The vibrator unit according to claim 17, further comprising:
a lid member forming an internal space between the base member and the lid member to accommodate the vibrator.

19. The vibrator unit according to claim 18, further comprising:
a bonding member that bonds the base member and the lid member so as to seal the internal space.

20. A vibration substrate having a main surface that extends parallel to a first direction and a second direction, the first direction and the second direction being orthogonal to each other, the vibration substrate comprising:
a main body region including a vibrating portion at least in a part of the main body region; and
at least one holding region arranged side by side with the main body region along the first direction, the at least one holding region including a holding portion defining a first recess portion extending from an outer side portion of the holding portion along the first direction and a second recess portion extending from the outer side portion of the holding portion along the second direction, and the first recess portion and the second recess portion overlap with each other along the first direction.

21. The vibration substrate according to claim 20, wherein the first recess portion, the second recess portion, and the main body region are arranged in this order along the first direction.

22. The vibration substrate according to claim 20, wherein at least one of the first recess portion and the second recess portion is a through-hole penetrating along a direction orthogonal to the main surface.

23. The vibration substrate according to claim 20, wherein in a plan view of the main surface, the first recess portion extends along and is inclined with respect to the first direction.

24. The vibration substrate according to claim 20, wherein in a plan view of the main surface, the second recess portion extends along and is inclined with respect to the second direction.

25. The vibration substrate according to claim 20, wherein the first recess portion narrows in width from the outer side portion toward a tip thereof along the first direction.

* * * * *